US011226926B2

(12) United States Patent
Noyes et al.

(10) Patent No.: US 11,226,926 B2
(45) Date of Patent: Jan. 18, 2022

(54) MULTI-LEVEL HIERARCHICAL ROUTING MATRICES FOR PATTERN-RECOGNITION PROCESSORS

(71) Applicant: Micron Technology, Inc., Boise, ID (US)

(72) Inventors: Harold B Noyes, Boise, ID (US); David R. Brown, Lucas, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/884,302

(22) Filed: May 27, 2020

(65) Prior Publication Data

US 2020/0285604 A1 Sep. 10, 2020

Related U.S. Application Data

(63) Continuation of application No. 15/137,877, filed on Apr. 25, 2016, now Pat. No. 10,684,983, which is a continuation of application No. 12/638,759, filed on Dec. 15, 2009, now Pat. No. 9,323,994.

(51) Int. Cl.
*G06F 15/80* (2006.01)
*H03K 19/17728* (2020.01)
*G06F 16/903* (2019.01)
*G06K 9/00* (2006.01)
*G06N 5/00* (2006.01)

(52) U.S. Cl.
CPC ........ *G06F 15/80* (2013.01); *G06F 16/90344* (2019.01); *G06K 9/00986* (2013.01); *G06N 5/003* (2013.01); *H03K 19/17728* (2013.01)

(58) Field of Classification Search
CPC ................................................ H03K 19/17728
See application file for complete search history.

(56) References Cited

U.S. PATENT DOCUMENTS

| 3,849,762 A | 11/1974 | Fujimoto et al. |
| 3,921,136 A | 11/1975 | Bar-Lev |
| 4,011,547 A | 3/1977 | Kimmel |
| 4,014,000 A | 3/1977 | Uno et al. |
| 4,123,695 A | 10/1978 | Hale et al. |
| 4,153,897 A | 5/1979 | Yasuda et al. |

(Continued)

FOREIGN PATENT DOCUMENTS

| CN | 1559072 | 12/2004 |
| EP | 0476159 A1 | 3/1992 |

(Continued)

OTHER PUBLICATIONS

Cheng et al., "Modern FPGA Architecture," Presentation slides, Dept. of Electrical Engineering, Imperial College London, Jan. 9, 2008.

(Continued)

*Primary Examiner* — Michael J Metzger
(74) *Attorney, Agent, or Firm* — Fletcher Yoder, P.C.

(57) ABSTRACT

Multi-level hierarchical routing matrices for pattern-recognition processors are provided. One such routing matrix may include one or more programmable and/or non-programmable connections in and between levels of the matrix. The connections may couple routing lines to feature cells, groups, rows, blocks, or any other arrangement of components of the pattern-recognition processor.

20 Claims, 18 Drawing Sheets

(56) References Cited

U.S. PATENT DOCUMENTS

| | | |
|---|---|---|
| 4,204,193 A | 5/1980 | Schroeder |
| 4,414,685 A | 11/1983 | Sternberg |
| 4,748,674 A | 5/1988 | Freeman |
| 5,014,327 A | 5/1991 | Potter et al. |
| 5,028,821 A | 7/1991 | Kaplinsky |
| 5,216,748 A | 6/1993 | Quenot et al. |
| 5,257,361 A | 10/1993 | Doi et al. |
| 5,287,523 A | 2/1994 | Allison et al. |
| 5,291,482 A | 3/1994 | McHarg et al. |
| 5,300,830 A | 4/1994 | Hawes |
| 5,331,227 A | 7/1994 | Hawes |
| 5,357,512 A | 10/1994 | Khaira et al. |
| 5,371,878 A | 12/1994 | Coker |
| 5,377,129 A | 12/1994 | Molvig et al. |
| 5,459,798 A | 10/1995 | Bailey et al. |
| 5,615,237 A | 3/1997 | Chang et al. |
| 5,659,551 A | 8/1997 | Huott et al. |
| 5,723,984 A | 3/1998 | Sharpe-Geisier |
| 5,754,878 A | 5/1998 | Asghar et al. |
| 5,790,531 A | 8/1998 | Ellebracht et al. |
| 5,818,254 A | 10/1998 | Agrawal et al. |
| 5,881,312 A | 3/1999 | Dulong |
| 5,896,548 A | 4/1999 | Ofek |
| 5,956,741 A | 9/1999 | Jones |
| 6,011,407 A | 1/2000 | New |
| 6,016,361 A | 1/2000 | Hongu et al. |
| 6,034,963 A | 3/2000 | Minami et al. |
| 6,041,405 A | 3/2000 | Green |
| 6,052,766 A | 4/2000 | Betker et al. |
| 6,058,469 A | 5/2000 | Baxter |
| 6,151,644 A | 11/2000 | Wu |
| 6,240,003 B1 | 5/2001 | McElroy |
| 6,279,128 B1 | 8/2001 | Arnold et al. |
| 6,317,427 B1 | 11/2001 | Augusta et al. |
| 6,362,868 B1 | 3/2002 | Silverbrook |
| 6,384,627 B1 * | 5/2002 | Fross .................. G06F 7/02 326/38 |
| 6,400,996 B1 | 6/2002 | Hoffberg et al. |
| 6,577,160 B2 | 6/2003 | Reddy et al. |
| 6,606,699 B2 | 8/2003 | Pechanek et al. |
| 6,614,703 B2 | 9/2003 | Pitts et al. |
| 6,625,740 B1 | 9/2003 | Datar et al. |
| 6,633,443 B1 | 10/2003 | Watanabe et al. |
| 6,636,483 B1 | 10/2003 | Pannell |
| 6,640,262 B1 | 10/2003 | Uppunda et al. |
| 6,697,979 B1 | 2/2004 | Vorbach et al. |
| 6,700,404 B1 | 3/2004 | Feng et al. |
| 6,838,904 B1 * | 1/2005 | Agrawal ......... H03K 19/17728 326/39 |
| 6,880,087 B1 | 4/2005 | Carter |
| 6,906,938 B2 | 6/2005 | Kaginele |
| 6,944,710 B2 | 9/2005 | Regev et al. |
| 6,977,897 B1 | 12/2005 | Nelson et al. |
| 7,010,639 B2 | 3/2006 | Larson et al. |
| 7,089,352 B2 | 8/2006 | Regev et al. |
| 7,146,643 B2 | 12/2006 | Dapp et al. |
| 7,176,717 B2 | 2/2007 | Sunkavalli et al. |
| 7,276,934 B1 | 10/2007 | Young |
| 7,305,047 B1 | 12/2007 | Turner |
| 7,358,761 B1 | 4/2008 | Sunkavalli et al. |
| 7,366,352 B2 | 4/2008 | Kravec et al. |
| 7,392,229 B2 | 6/2008 | Harris et al. |
| 7,428,722 B2 | 9/2008 | Sunkavalli et al. |
| 7,487,131 B2 | 2/2009 | Harris et al. |
| 7,487,542 B2 | 2/2009 | Boulanger et al. |
| 7,499,464 B2 | 3/2009 | Ayrapetian et al. |
| 7,725,510 B2 | 5/2010 | Alicherry et al. |
| 7,774,286 B1 | 8/2010 | Harris |
| 7,804,719 B1 | 9/2010 | Chirania et al. |
| 7,890,923 B2 | 2/2011 | Elaasar |
| 7,899,052 B1 | 3/2011 | Hao et al. |
| 7,916,510 B1 | 3/2011 | Starovoitov et al. |
| 7,917,684 B2 | 3/2011 | Noyes et al. |
| 7,970,964 B2 | 6/2011 | Noyes |
| 8,015,530 B1 | 9/2011 | Sinclair et al. |
| 8,020,131 B1 | 9/2011 | Van Mau et al. |
| 8,065,249 B1 | 11/2011 | Harris et al. |
| 8,140,780 B2 | 3/2012 | Noyes |
| 8,146,040 B1 | 3/2012 | Janneck et al. |
| 8,159,900 B2 | 4/2012 | Moore et al. |
| 8,209,521 B2 | 6/2012 | Noyes et al. |
| 8,214,672 B2 | 7/2012 | Pawlowski |
| 8,239,660 B2 | 8/2012 | Cervini |
| 8,281,395 B2 | 10/2012 | Pawlowski |
| 8,294,490 B1 | 10/2012 | Kaviani |
| 8,402,188 B2 | 3/2013 | Noyes et al. |
| 8,536,896 B1 | 9/2013 | Trimberger |
| 8,593,175 B2 | 11/2013 | Noyes et al. |
| 8,648,621 B2 | 2/2014 | Noyes et al. |
| 8,680,888 B2 | 3/2014 | Brown et al. |
| 8,725,961 B2 | 5/2014 | Noyes |
| 8,782,624 B2 | 7/2014 | Brown et al. |
| 8,843,523 B2 | 9/2014 | Noyes |
| 8,938,590 B2 | 1/2015 | Noyes et al. |
| 9,058,465 B2 | 6/2015 | Noyes et al. |
| 9,063,532 B2 | 6/2015 | Brown |
| 9,075,428 B2 | 7/2015 | Brown |
| 9,118,327 B2 | 8/2015 | Noyes et al. |
| 9,164,945 B2 | 10/2015 | Noyes |
| 9,235,798 B2 | 1/2016 | Brown et al. |
| 2001/0018762 A1 * | 8/2001 | Lenzie ................ G06F 30/34 716/111 |
| 2001/0041012 A1 | 11/2001 | Hsieh et al. |
| 2002/0186044 A1 | 12/2002 | Agrawal et al. |
| 2003/0107996 A1 | 6/2003 | Black et al. |
| 2003/0142698 A1 | 7/2003 | Parhl |
| 2003/0163615 A1 | 8/2003 | Yu |
| 2003/0226002 A1 | 12/2003 | Boutaud et al. |
| 2004/0100980 A1 | 5/2004 | Jacobs et al. |
| 2004/0125807 A1 | 7/2004 | Liu et al. |
| 2004/0151211 A1 | 8/2004 | Snider |
| 2004/0184662 A1 | 9/2004 | Kravec et al. |
| 2005/0154916 A1 | 7/2005 | Boulanger et al. |
| 2005/0251638 A1 | 11/2005 | Boutaud et al. |
| 2006/0158219 A1 | 7/2006 | Sunkavalli et al. |
| 2006/0195496 A1 | 8/2006 | Vadi et al. |
| 2006/0206875 A1 | 9/2006 | Ullmann et al. |
| 2006/0257043 A1 | 11/2006 | Chiu |
| 2006/0274001 A1 | 12/2006 | Guttag et al. |
| 2006/0288070 A1 | 12/2006 | Vadi et al. |
| 2007/0005869 A1 | 1/2007 | Balraj et al. |
| 2007/0075878 A1 | 4/2007 | Furodet et al. |
| 2007/0127482 A1 | 6/2007 | Harris et al. |
| 2007/0150623 A1 | 6/2007 | Kravec et al. |
| 2007/0282833 A1 | 12/2007 | McMillen |
| 2007/0283108 A1 | 12/2007 | Isherwood et al. |
| 2008/0126690 A1 | 5/2008 | Rajan et al. |
| 2008/0129334 A1 | 6/2008 | Sunkavalli et al. |
| 2008/0133874 A1 | 6/2008 | Capek et al. |
| 2008/0140661 A1 | 6/2008 | Pandya |
| 2008/0178031 A1 | 7/2008 | Dong-Han |
| 2008/0256347 A1 | 10/2008 | Eickemeyer et al. |
| 2008/0265938 A1 | 10/2008 | Ting |
| 2008/0320053 A1 | 12/2008 | Iijima et al. |
| 2009/0198952 A1 | 8/2009 | Khmeinitsky et al. |
| 2009/0204734 A1 | 8/2009 | Strait et al. |
| 2010/0100691 A1 | 4/2010 | Noyes et al. |
| 2010/0100714 A1 | 4/2010 | Noyes et al. |
| 2010/0115173 A1 | 5/2010 | Noyes |
| 2010/0115347 A1 | 5/2010 | Noyes |
| 2010/0118425 A1 | 5/2010 | Rafaelof |
| 2010/0138432 A1 | 6/2010 | Noyes |
| 2010/0138575 A1 | 6/2010 | Noyes |
| 2010/0138634 A1 | 6/2010 | Noyes |
| 2010/0138635 A1 | 6/2010 | Noyes |
| 2010/0175130 A1 | 6/2010 | Pawlowski |
| 2010/0174887 A1 | 7/2010 | Pawlowski |
| 2010/0174929 A1 | 7/2010 | Pawlowski |
| 2010/0185647 A1 | 7/2010 | Noyes |
| 2010/0145182 A1 | 10/2010 | Schmidt et al. |
| 2010/0325352 A1 | 12/2010 | Schuette et al. |
| 2010/0332809 A1 | 12/2010 | Noyes et al. |
| 2011/0004578 A1 | 1/2011 | Momma et al. |
| 2011/0145182 A1 | 6/2011 | Dlugosch |

(56) References Cited

U.S. PATENT DOCUMENTS

| | | |
|---|---|---|
| 2011/0145544 A1 | 6/2011 | Noyes et al. |
| 2011/0161620 A1 | 6/2011 | Kaminski et al. |
| 2011/0208900 A1 | 8/2011 | Schuette et al. |
| 2011/0258360 A1 | 10/2011 | Noyes |
| 2011/0145271 A1 | 12/2011 | Noyes et al. |
| 2011/0307233 A1 | 12/2011 | Tseng et al. |
| 2011/0307433 A1 | 12/2011 | Dlugosch |
| 2011/0307503 A1 | 12/2011 | Dlugosch |
| 2011/0320759 A1 | 12/2011 | Craddock et al. |
| 2012/0192163 A1 | 6/2012 | Glendenning et al. |
| 2012/0179854 A1 | 7/2012 | Noyes |
| 2012/0192164 A1 | 7/2012 | Xu et al. |
| 2012/0192165 A1 | 7/2012 | Xu et al. |
| 2012/0192166 A1 | 7/2012 | Xu et al. |
| 2013/0154685 A1 | 6/2013 | Noyes |
| 2013/0156043 A1 | 6/2013 | Brown et al. |
| 2013/0159239 A1 | 6/2013 | Brown et al. |
| 2013/0159670 A1 | 6/2013 | Noyes |
| 2013/0159671 A1 | 6/2013 | Brown et al. |
| 2013/0275709 A1 | 10/2013 | Gajapathy |
| 2014/0025614 A1 | 1/2014 | Noyes et al. |
| 2014/0025923 A1 | 1/2014 | Klein |
| 2014/0067736 A1 | 3/2014 | Noyes |
| 2014/0204956 A1 | 7/2014 | Brown et al. |
| 2014/0225889 A1 | 8/2014 | Kim et al. |
| 2014/0279776 A1 | 9/2014 | Brown et al. |
| 2014/0325494 A1 | 10/2014 | Brown et al. |

FOREIGN PATENT DOCUMENTS

| | | |
|---|---|---|
| EP | 0943995 | 9/1999 |
| JP | 08087462 | 4/1996 |
| JP | 10069459 | 3/1998 |
| JP | 10111862 A | 4/1998 |
| JP | 2000231549 A | 8/2000 |
| JP | 2000347708 A | 12/2000 |
| JP | 2006018539 | 1/2006 |
| KR | 1020080097573 A | 11/2008 |
| WO | WO0065425 A1 | 11/2000 |
| WO | WO0138978 | 5/2001 |
| WO | WO03039001 A1 | 5/2003 |
| WO | WO2005036750 A1 | 4/2005 |
| WO | WO2011114120 A1 | 9/2011 |

OTHER PUBLICATIONS

Sathe et al., "Comparison of Commercially Available FPGA Architectures," Proceedings of Southeast Conference '94, 2002.
Sidhu et al., "String Mathing on Multicontext FPGAs Using Self-Reconfiguration," Feb. 1999, Proceedings of the 1999 ACM/SIGDA Seventh International Symposium on Field Programmable Gate Arrays, pp. 217-226.
Sidhu et al., "A Self-Reconfigurable Gate Array Architecture", Aug. 2000, Proceedings of the Roadmap to Reconfigurable Computing, 10th International Workshop on Field-Programmable Logic and Applications, pp. 106-120.
Clark et al., "Efficient Reconfigurable Logic Circuits for Matching Complex Network Intrusion Detection Patterns," 2003, School of Electrical and Computer Engineering, Georgia Institute of Technology, Atlanta, Georgia, vol. 2778, pp. 956-959.
Tiwari et al., "Saving Power by Mapping Finite-State Machines into Embedded Memory Blocks in FPGAs," Department of ECECS, University of Cincinnati, USA, Feb. 16-20, 2004, vol. 2, pp. 916-921.
Bispo, "Regular Expression Matching for Reconfigurable Packet Inspection," Field Programmable Technology, 2006. FPT 2006. Dec. 1, 2006, pp. 119-126.
Moscola et al., "Implementation of Network Application Layer Parser for Multiple TCP/IP Flows in Reconfigurable Devices," Department of Computer Science and Engineering Washington University, St. Louis, MO, 2006, pp. 1-4.

Mitra et al., "Compiling PCRE to FPGA for Accelerating SNORT IDS," Department of Computer Science and Engineering University of California, Riverside, Dec. 3, 2007, pp. 127-135.
Korenek, "Traffic Scanner-Hardware Accelerated Intrusion Detection System," http://www.liberouter.org/ 2007, pp. 1-23.
Lin et al; "Optimization of Pattern Matching Circuits for Regular Expression on FPGA," Piscataway, NJ, USA, vol. 12, Dec. 1, 2007, pp. 1303-1310.
Anomynous, "Field-Programmable Gate Array," Wikipedia, the free encyclopedia, Jun. 9, 2011, pp. 1-11, XP055000431, Retrieved from the Internet.
PCT/US2010/059310 International Search Report and Written Opinion dated Jun. 28, 2011.
Chinese Office Action and translation dated Jan. 27, 2014.
Japanese Office Action and translation dated Apr. 10, 2014.
European Article 94(3) dated Apr. 17, 2015.
Beesley, K. R.; Arabic Morphology Using Only Finite-State Operations; Xerox Research Centre Europe; pp. 50-57; 1998.
Bird, S. et al.; One-Level Phonology: Autosegmental Representations and Rules as Finite Automata; Association for Computational Linguistics; University of Edinburgh; vol. 20; No. 1; pp. 55-90; 1994.
Bispo, J. et al.; Regular Expression Matching for Reconfigurable Packet Inspection; IEEE International Conference on Field Programmable Technology; 2006.
Bispo, J. et al.; Synthesis of Regular Expressions Targeting FPGAs: Current Status and Open Issues; IST/INESC-ID, Libson, Portugal; pp. 1-12; 2007.
Brodie, B. et al.; A scalable Architecture for High-Throughput Regular-Expression Pattern Matching; Exegy Inc.; pp. 1-12; 2006.
Clark, C.; Design of Efficient FPGA Circuits for Matching Complex Patterns in Network Intrusion Detection Systems (Master of Science Thesis); Georgia Institute of Technology; pp. 1-56; Dec. 2003.
Clark, C.; A Unified Model of Pattern-Matching Circuits for Field-Programmable Gate Arrays [Doctoral Dissertation]; Georgia Institute of Technology; pp. 1-177; 2006.
Clark, C. et al.; Scalable Pattern Matching for High Speed Networks; Proceedings of the 12$^{th}$ Annual IEEE symposium on Field-Programmable Custom Computing Machines (FCCM'04);Georgia Institute of Technology; pp. 1-9; 2004.
Clark, C. et al.; A Unified Model of Pattern-Matching Circuit Architectures; Tech Report GIT-CERCS-05-20;Georgia Institute of Technology; pp. 1-17; 2005.
Fide, S.; String Processing in Hardware; Scalable Parallel and Distributed Systems Lab; Proceedings of the 12$^{th}$ Annual IEEE symposium on Field-Programmable Custom Computing Machines (FCCM'04); School of Electrical and Computer Engineering; Georgia Institute of Technology; pp. 1-9; 2004.
Fisk, M. et al.; Applying Fast String Matching to Intrusion Detection; Los Alamos National Laboratory; University of California San Diego; pp. 1-21; 2002.
Korenek, J.; Traffic Scanner-Hardware Accelerated Intrusion Detection System; http://www.liberouter.org/; 2006.
Kumar, S. et al.; Curing Regular Expressions matching Algorithms from Insomnia, Amnesia, and Acaluia; Department of Computer Science and Engineering; Washington University in St. Louis; pp. 1-17; Apr. 27, 2007.
Lipovski, G.; Dynamic Systolic Associative Memory Chip; IEEE; Department of Electrical and Computer Engineering; University of Texas at Austin; pp. 481-492; 1990.
Lin, C. et al.; Optimization of Pattern Matching Circuits for Regular Expression on FPGA; IEEE Transactions on Very Large Scale Integrations Systems; vol. 15, No. 12, pp. 1-6; Dec. 2007.
Schultz, K. et al; Fully Parallel Integrated CAM/RAM Using Preclassification to Enable Large Capacities; IEEE Journal on Solid-State Circuits; vol. 31; No. 5; pp. 689-699; May 1996.
Shafai, F. et al.; Fully Parallel 30-MHz, 2.5-Mb CAM; IEEE Journal of Solid-State Circuits, vol. 33; No. 11; pp. 1690-1696; Nov. 1998.
Sidhu, R. et al.; Fast Regular Expression Pattern Matching using FPGAs; Department of EE-Systems; University of Southern California; pp. 1-12; 2001.
Wada, T.; Multiobject Behavior Recognition Event Driven Selective Attention Method; IEEE; pp. 1-16; 2000.

(56) References Cited

OTHER PUBLICATIONS

Yu, F.; High Speed Deep Packet Inspection with Hardware Support; Electrical Engineering and Computer Sciences; University of California at Berkeley; pp. 1-217; Nov. 22, 2006.
Freescale and Kaspersky® Accelerated Antivirus Solution Platform for OEM Vendors; Freescale Semiconductors Document; pp. 1-16; 2007.
PCT/US2009/067534 International Search Report and Written Opinion dated Apr. 26, 2010.
PCT/US2009/061649 International Search Report dated Feb. 15, 2010.
Taiwan Application No. 098144804 Office Action dated Nov. 4, 2013.
PCT/US2012/067992 International Search Report dated Mar. 28, 2013.
PCT/US2012/068011 International Search Report dated Apr. 15, 2013.
PCT/US2012/067999 International Search Report dated May 14, 2013.
PCT/US2012/067995 International Search Report dated May 17, 2013.
PCT/US2012/067988 International Search Report (Partial) dated Jun. 24, 2014.
PCT/US2013/049744 International Search Report and Written Opinion dated Oct. 22, 2013.
PCT/US2013/049748 International Search Report and Written Opinion dated Oct. 22, 2013.
PCT/US2013/049755 International Search Report and Written Opinion dated Oct. 24, 2013.
PCT/US2013/049753 International Search Report and Written Opinion dated Nov. 7, 2013.
PCT/US2013/055434 International Search Report and Written Opinion dated Nov. 29, 2013.
PCT/US2013/055438 International Search Report and Written Opinion dated Nov. 29, 2013.
PCT/US2013/055436 International Search Report and Written Opinion dated Dec. 9, 2013.
PCT/US2014/023589 International Search Report and Written Opinion dated Jul. 24, 2014.
Soewito et al., "Self-Addressable Memory-Based FSM: A scalable Intrusion Detection Engine", IEEE Network, pp. 14-21; Feb. 2009.
Hurson A. R.; A VLSI Design for the Parallel Finite State Automation and Its Performance Evaluation as a Hardware Scanner; International Journal of Computer and Information Sciences, vol. 13, No. 6; 1984.
Carpenter et al., "A Massively Parallel Architecture for a Self-Organizing Neural Pattern Recognition Machine", Academic Press, Inc.; 1987.
Cong et al., "Application-Specific Instruction Generation for Configurable Processor Architectures", Computer Science Department, University of California, ACM; 2004.
Glette et al., "An Online EHW Pattern Recognition System Applied to Face Image Recognition", University of Oslo, Norway; 2007.
Kawai et al., "An Adaptive Pattern Recognition Hardware with On-chip Shift Register-based Partial Reconfiguration", IEEE; 2008.
Kutrib et al., "Massively Parallel Pattern Recognition with Link Features", IFIG Research Report 0003; 2000.
Marculescu et al., Power Management of Multi-Core Systems: Challenges, Approaches, and Recent Developments Tutorial at ASPLOS, London, UK [online]; Mar. 4, 2012.
Vitanen et al.; Image Pattern Recognition Using Configurable Logic Cell Array; New Advances in Computer Graphics; pp. 355-368; 1989.
Yasunaga et al., "Kernel-based Pattern Recognition Hardware: Its Design Methodology Using Evolved Truth Tables", IEEE, 2000.
U.S. Appl. No. 60/652,738, filed Feb. 12, 2005, Harris.
U.S. Appl. No. 61/788,364, filed Mar. 15, 2013, Brown et al.

\* cited by examiner

MULTI-LEVEL HIERARCHICAL ROUTING MATRICES FOR PATTERN-RECOGNITION PROCESSORS

CROSS-REFERENCE TO RELATED APPLICATIONS

The present application is a continuation of U.S. application Ser. No. 15/137,877 entitled "Multi-Level Hierarchical Routing Matrices For Pattern-Recognition Processors," and filed Apr. 25, 2016, now U.S. Pat. No. 10,684,983 which issued on Jun. 16, 2020, which is a continuation of U.S. patent application Ser. No. 12/638,759 entitled "Multi-Level Hierarchical Routing Matrices For Pattern-Recognition Processors," and filed Dec. 15, 2009, now U.S. Pat. No. 9,323,994 which issued on Apr. 26, 2016, the entirety of which is incorporated by reference herein for all purposes.

BACKGROUND

Field of Invention

Embodiments of the invention relate generally to pattern-recognition processors and, more specifically, in certain embodiments, to connection architectures of such processors.

Description of Related Art

In the field of computing, pattern recognition tasks are increasingly challenging. Ever larger volumes of data are transmitted between computers, and the number of patterns that users wish to identify is increasing. For example, spam or malware are often detected by searching for patterns in a data stream, e.g., particular phrases or pieces of code. The number of patterns increases with the variety of spam and malware, as new patterns may be implemented to search for new variants. Searching a data stream for each of these patterns can form a computing bottleneck. Often, as the data stream is received, it is searched for each pattern, one at a time. The delay before the system is ready to search the next portion of the data stream increases with the number of patterns. Thus, pattern recognition may slow the receipt of data.

Such patter-recognition processors may include a large number of finite state machines (FSM) that move from state to state as inputs are processed. Internal connections of conventional processors rely on physical wires connected to a flip-fop or other memory element. However, such connections may be incapable of meeting the performance for a pattern-search processor. Further, such connections are generally not configurable or capable of meeting a desired functionality. The distance, speed, and configurability of the connections in a pattern-recognition processor may be challenging to implement in silicon.

DETAILED DESCRIPTION

Figure 1:
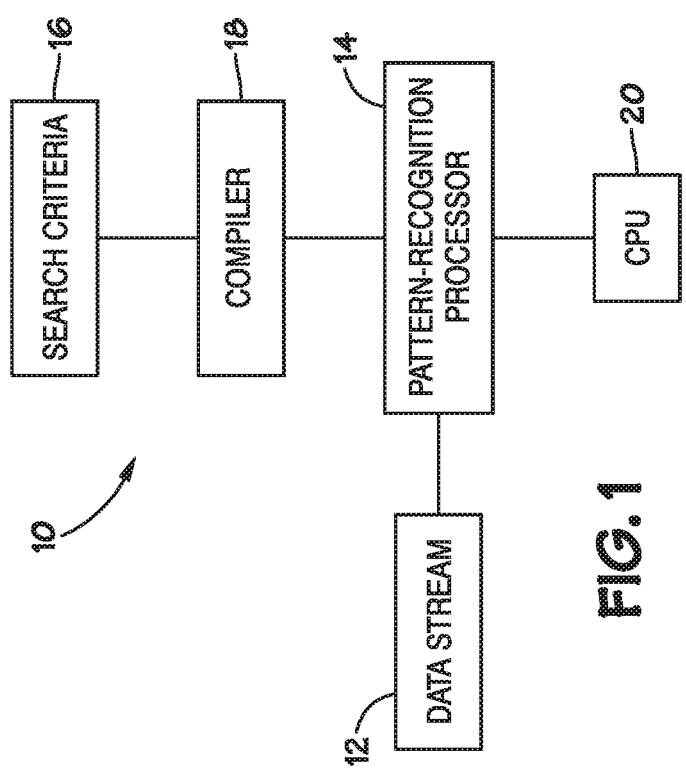
FIG. 1 depicts an example of system that searches a data stream.

FIG. 1 depicts an example of a system 10 that searches a data stream 12. The system 10 may include a pattern-recognition processor 14 that searches the data stream 12 according to search criteria 16.

Each search criterion may specify one or more target expressions, i.e., patterns. The phrase "target expression" refers to a sequence of data for which the pattern-recognition processor 14 is searching. Examples of target expressions include a sequence of characters that spell a certain word, a sequence of genetic base pairs that specify a gene, a sequence of bits in a picture or video file that form a portion of an image, a sequence of bits in an executable file that form a part of a program, or a sequence of bits in an audio file that form a part of a song or a spoken phrase.

A search criterion may specify more than one target expression. For example, a search criterion may specify all five-letter words beginning with the sequence of letters "cl", any word beginning with the sequence of letters "cl", a paragraph that includes the word "cloud" more than three times, etc. The number of possible sets of target expressions is arbitrarily large, e.g., there may be as many target expressions as there are permutations of data that the data stream could present. The search criteria may be expressed in a variety of formats, including as regular expressions, a programming language that concisely specifies sets of target expressions without necessarily listing each target expression.

Each search criterion may be constructed from one or more search terms. Thus, each target expression of a search criterion may include one or more search terms and some target expressions may use common search terms. As used herein, the phrase "search term" refers to a sequence of data that is searched for, during a single search cycle. The sequence of data may include multiple bits of data in a binary format or other formats, e.g., base ten, ASCII, etc. The sequence may encode the data with a single digit or multiple digits, e.g., several binary digits. For example, the pattern-recognition processor 14 may search a text data stream 12 one character at a time, and the search terms may specify a set of single characters, e.g., the letter "a", either the letters "a" or "e", or a wildcard search term that specifies a set of all single characters.

Search terms may be smaller or larger than the number of bits that specify a character (or other grapheme—i.e., fundamental unit—of the information expressed by the data stream, e.g., a musical note, a genetic base pair, a base-10 digit, or a sub-pixel). For instance, a search term may be 8 bits and a single character may be 16 bits, in which case two consecutive search terms may specify a single character.

The search criteria 16 may be formatted for the pattern-recognition processor 14 by a compiler 18. Formatting may include deconstructing search terms from the search criteria. For example, if the graphemes expressed by the data stream 12 are larger than the search terms, the compiler may deconstruct the search criterion into multiple search terms to search for a single grapheme. Similarly, if the graphemes expressed by the data stream 12 are smaller than the search terms, the compiler 18 may provide a single search term, with unused bits, for each separate grapheme. The compiler 18 may also format the search criteria 16 to support various regular expressions operators that are not natively supported by the pattern-recognition processor 14.

The pattern-recognition processor 14 may search the data stream 12 by evaluating each new term from the data stream 12. The word "term" here refers to the amount of data that could match a search term. During a search cycle, the pattern-recognition processor 14 may determine whether the currently presented term matches the current search term in the search criterion. If the term matches the search term, the evaluation is "advanced", i.e., the next term is compared to the next search term in the search criterion. If the term does not match, the next term is compared to the first term in the search criterion, thereby resetting the search.

Each search criterion may be compiled into a different finite state machine (FSM) in the pattern-recognition processor 14. The finite state machines may run in parallel, searching the data stream 12 according to the search criteria 16. The finite state machines may step through each successive search term in a search criterion as the preceding search term is matched by the data stream 12, or if the search term is unmatched, the finite state machines may begin searching for the first search term of the search criterion.

The pattern-recognition processor 14 may evaluate each new term according to several search criteria, and their respective search terms, at about the same time, e.g., during a single device cycle. The parallel finite state machines may each receive the term from the data stream 12 at about the same time, and each of the parallel finite state machines may determine whether the term advances the parallel finite state machine to the next search term in its search criterion. The parallel finite state machines may evaluate terms according to a relatively large number of search criteria, e.g., more than 100, more than 1000, or more than 10,000. Because they operate in parallel, they may apply the search criteria to a data stream 12 having a relatively high bandwidth, e.g., a data stream 12 of greater than or generally equal to 64 MB per second or 128 MB per second, without slowing the data stream. In some embodiments, the search-cycle duration does not scale with the number of search criteria, so the number of search criteria may have little to no effect on the performance of the pattern-recognition processor 14.

When a search criterion is satisfied (i.e., after advancing to the last search term and matching it), the pattern-recognition processor 14 may report the satisfaction of the criterion to a processing unit, such as a central processing unit (CPU) 20. The central processing unit 20 may control the pattern-recognition processor 14 and other portions of the system 10.

The system 10 may be any of a variety of systems or devices that search a stream of data. For example, the system 10 may be a desktop, laptop, handheld or other type of computer that searches the data stream 12. The system 10 may also be a network node, such as a router, a server, or a client (e.g., one of the previously-described types of computers). The system 10 may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The data stream 12 may be one or more of a variety of types of data streams that a user or other entity might wish to search. For example, the data stream 12 may be a stream of data received over a network, such as packets received over the Internet or voice or data received over a cellular network. The data stream 12 may be data received from a sensor in communication with the system 10, such as an imaging sensor, a temperature sensor, an accelerometer, or the like, or combinations thereof. The data stream 12 may be received by the system 10 as a serial data stream, in which the data is received in an order that has meaning, such as in a temporally, lexically, or semantically significant order. Or the data stream 12 may be received in parallel or out of order and, then, converted into a serial data stream, e.g., by reordering packets received over the Internet. In some embodiments, the data stream 12 may present terms serially, but the bits expressing each of the terms may be received in parallel. The data stream 12 may be received from a source external to the system 10, or may be formed by interrogating a memory device and forming the data stream 12 from stored data.

Depending on the type of data in the data stream 12, different types of search criteria may be chosen by a designer. For instance, the search criteria 16 may be a virus definition file. Viruses or other malware may be characterized, and aspects of the malware may be used to form search criteria that indicate whether the data stream 12 is likely delivering malware. The resulting search criteria may be stored on a server, and an operator of a client system may subscribe to a service that downloads the search criteria to the system 10. The search criteria 16 may be periodically updated from the server as different types of malware emerge. The search criteria may also be used to specify undesirable content that might be received over a network, for instance unwanted emails (commonly known as spam) or other content that a user finds objectionable.

The data stream 12 may be searched by a third party with an interest in the data being received by the system 10. For example, the data stream 12 may be searched for text, a sequence of audio, or a sequence of video that occurs in a copyrighted work. The data stream 12 may be searched for utterances that are relevant to a criminal investigation or civil proceeding or are of interest to an employer. In other embodiments, monitoring a data stream for data of interest may be an example of searching.

The search criteria 16 may also include patterns in the data stream 12 for which a translation is available, e.g., in memory addressable by the CPU 20 or the pattern-recognition processor 14. For instance, the search criteria 16 may each specify an English word for which a corresponding Spanish word is stored in memory. In another example, the search criteria 16 may specify encoded versions of the data stream 12, e.g., MP3, MPEG 4, FLAC, Ogg Vorbis, etc., for which a decoded version of the data stream 12 is available, or vice versa.

The pattern-recognition processor 14 may be hardware that is integrated with the CPU 20 into a single component (such as a single device) or may be formed as a separate component. For instance, the pattern-recognition processor 14 may be a separate integrated circuit. The pattern-recognition processor 14 may be referred to as a "co-processor" or a "pattern-recognition co-processor".

Figure 2:
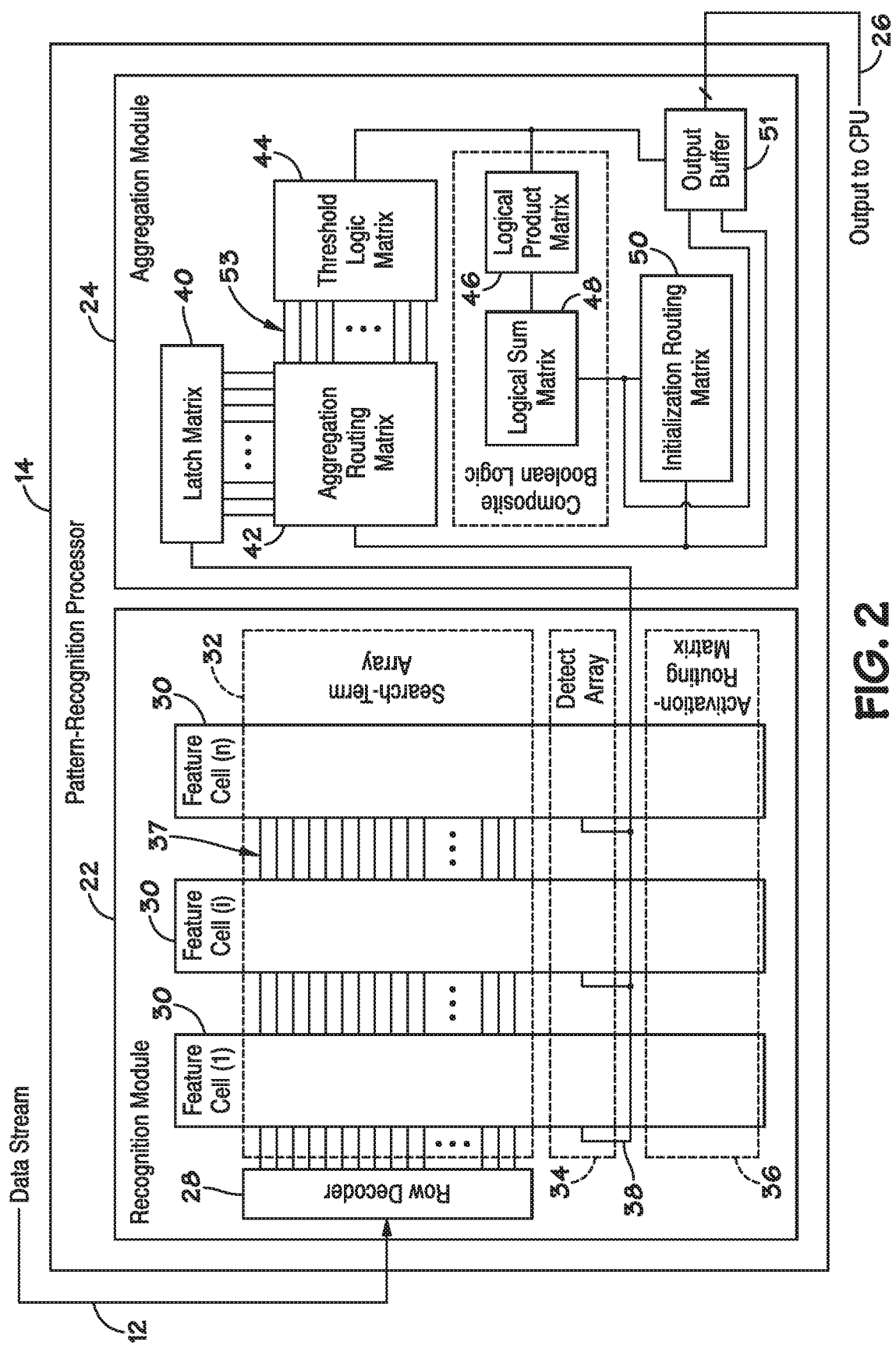
FIG. 2 depicts an example of a pattern-recognition processor in the system of FIG. 1.

FIG. 2 depicts an example of the pattern-recognition processor 14. The pattern-recognition processor 14 may include a recognition module 22 and an aggregation module 24. The recognition module 22 may be configured to compare received terms to search terms, and both the recognition module 22 and the aggregation module 24 may cooperate to determine whether matching a term with a search term satisfies a search criterion.

The recognition module 22 may include a row decoder 28 and a plurality of feature cells 30. Each feature cell 30 may specify a search term, and groups of feature cells 30 may form a parallel finite state machine that forms a search criterion. Components of the feature cells 30 may form a search-term array 32, a detection array 34, and an activation-routing matrix 36. The search-term array 32 may include a plurality of input conductors 37, each of which may place each of the feature cells 30 in communication with the row decoder 28.

The row decoder 28 may select particular conductors among the plurality of input conductors 37 based on the content of the data stream 12. For example, the row decoder 28 may be a one byte to 256 row decoder that activates one of 256 rows based on the value of a received byte, which may represent one term. A one-byte term of 0000 0000 may correspond to the top row among the plurality of input conductors 37, and a one-byte term of 1111 1111 may correspond to the bottom row among the plurality of input conductors 37. Thus, different input conductors 37 may be selected, depending on which terms are received from the data stream 12. As different terms are received, the row decoder 28 may deactivate the row corresponding to the previous term and activate the row corresponding to the new term.

The detection array 34 may couple to a detection bus 38 that outputs signals indicative of complete or partial satisfaction of search criteria to the aggregation module 24. The activation-routing matrix 36 may selectively activate and deactivate feature cells 30 based on, for example, the number of search terms in a search criterion that have been matched.

The aggregation module 24 may include a latch matrix 40, an aggregation-routing matrix 42, a threshold-logic matrix 44, a logical-product matrix 46, a logical-sum matrix 48, and an initialization-routing matrix 50.

The latch matrix 40 may implement portions of certain search criteria. Some search criteria, e.g., some regular expressions, count only the first occurrence of a match or group of matches. The latch matrix 40 may include latches that record whether a match has occurred. The latches may be cleared during initialization, and periodically re-initialized during operation, as search criteria are determined to be satisfied or not further satisfiable—i.e., an earlier search term may need to be matched again before the search criterion could be satisfied.

The aggregation-routing matrix 42 may function similar to the activation-routing matrix 36. The aggregation-routing matrix 42 may receive signals indicative of matches on the detection bus 38 and may route the signals to different group-logic lines 53 connecting to the threshold-logic matrix 44. The aggregation-routing matrix 42 may also route outputs of the initialization-routing matrix 50 to the detection array 34 to reset portions of the detection array 34 when a search criterion is determined to be satisfied or not further satisfiable.

The threshold-logic matrix 44 may include a plurality of counters, e.g., 32-bit counters configured to count up or down. The threshold-logic matrix 44 may be loaded with an initial count, and it may count up or down from the count based on matches signaled by the recognition module. For instance, the threshold-logic matrix 44 may count the number of occurrences of a word in some length of text.

The outputs of the threshold-logic matrix 44 may be inputs to the logical-product matrix 46. The logical-product matrix 46 may selectively generate "product" results (e.g., "AND" function in Boolean logic). The logical-product matrix 46 may be implemented as a square matrix, in which the number of output products is equal the number of input lines from the threshold-logic matrix 44, or the logical-product matrix 46 may have a different number of inputs than outputs. The resulting product values may be output to the logical-sum matrix 48.

The logical-sum matrix 48 may selectively generate sums (e.g., "OR" functions in Boolean logic.) The logical-sum matrix 48 may also be a square matrix, or the logical-sum matrix 48 may have a different number of inputs than outputs. Since the inputs are logical products, the outputs of the logical-sum matrix 48 may be logical-Sums-of-Products (e.g., Boolean logic Sum-of-Product (SOP) form). The output of the logical-sum matrix 48 may be received by the initialization-routing matrix 50.

The initialization-routing matrix 50 may reset portions of the detection array 34 and the aggregation module 24 via the aggregation-routing matrix 42. The initialization-routing matrix 50 may also be implemented as a square matrix, or the initialization-routing matrix 50 may have a different number of inputs than outputs. The initialization-routing matrix 50 may respond to signals from the logical-sum matrix 48 and re-initialize other portions of the pattern-recognition processor 14, such as when a search criterion is satisfied or determined to be not further satisfiable.

The aggregation module 24 may include an output buffer 51 that receives the outputs of the threshold-logic matrix 44, the aggregation-routing matrix 42, and the logical-sum matrix 48. The output of the aggregation module 24 may be transmitted from the output buffer 51 to the CPU 20 (FIG. 1) on the output bus 26. In some embodiments, an output multiplexer may multiplex signals from these components 42, 44, and 48 and output signals indicative of satisfaction of criteria or matches of search terms to the CPU 20 (FIG. 1). In other embodiments, results from the pattern-recognition processor 14 may be reported without transmitting the signals through the output multiplexer, which is not to suggest that any other feature described herein could not also be omitted. For example, signals from the threshold-logic matrix 44, the logical-product matrix 46, the logical-sum matrix 48, or the initialization routing matrix 50 may be transmitted to the CPU in parallel on the output bus 26.

Figure 3:
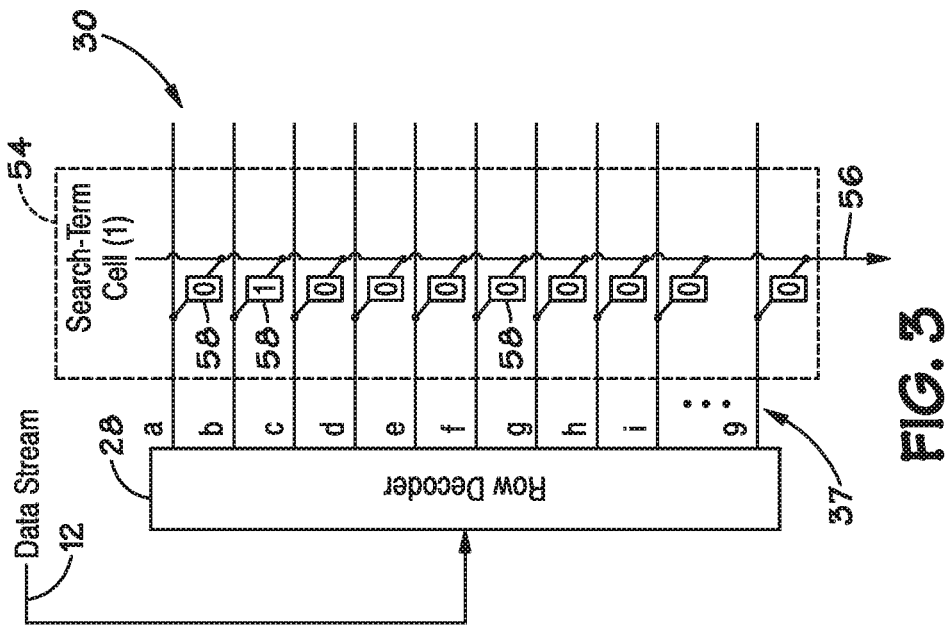
FIG. 3 depicts an example of a search-term cell in the pattern-recognition processor of FIG. 2.

FIG. 3 illustrates a portion of a single feature cell 30 in the search-term array 32 (FIG. 2), a component referred to herein as a search-term cell 54. The search-term cells 54 may include an output conductor 56 and a plurality of memory cells 58. Each of the memory cells 58 may be coupled to both the output conductor 56 and one of the conductors among the plurality of input conductors 37. In response to its input conductor 37 being selected, each of the memory cells 58 may output a value indicative of its stored value, outputting the data through the output conductor 56. In some embodiments, the plurality of input conductors 37 may be referred to as "word lines", and the output conductor 56 may be referred to as a "data line".

The memory cells 58 may include any of a variety of types of memory cells. For example, the memory cells 58 may be volatile memory, such as dynamic random access memory (DRAM) cells having a transistor and a capacitor. The source and the drain of the transistor may be connected to a plate of the capacitor and the output conductor 56, respectively, and the gate of the transistor may be connected to one of the input conductors 37. In another example of volatile memory, each of the memory cells 58 may include a static random access memory (SRAM) cell. The SRAM cell may have an output that is selectively coupled to the output conductor 56 by an access transistor controlled by one of the input conductors 37. The memory cells 58 may also include nonvolatile memory, such as phase-change memory (e.g., an ovonic device), flash memory, silicon-oxide-nitride-oxide-silicon (SONOS) memory, magneto-resistive memory, or other types of nonvolatile memory. The memory cells 58 may also include flip-flops, e.g., memory cells made out of logic gates.

Figure 5:
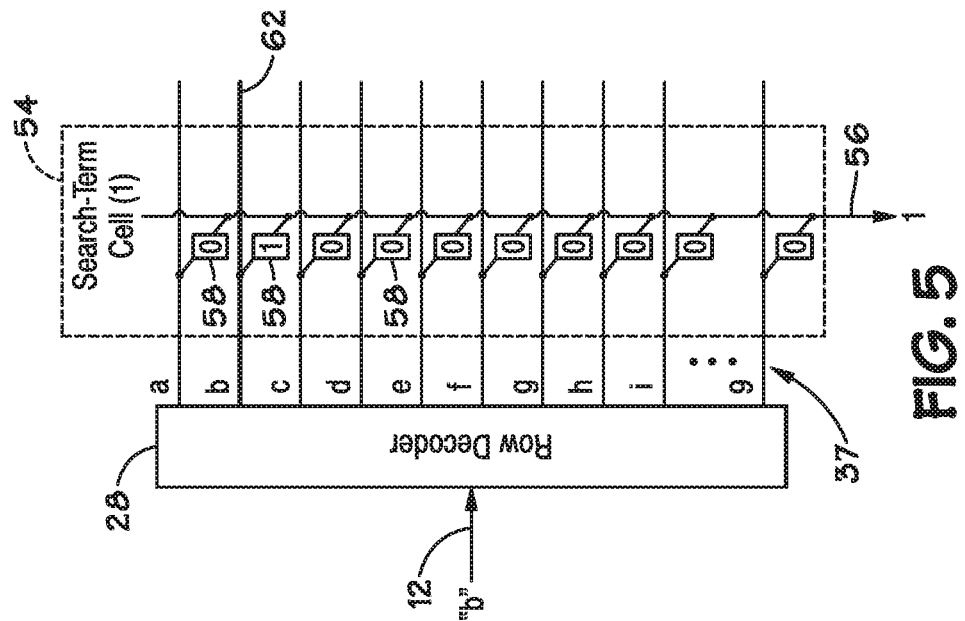
FIGS. 4 and 5 depict the search-term cell of FIG. 3 searching the data stream for a single character.
Figure 4:
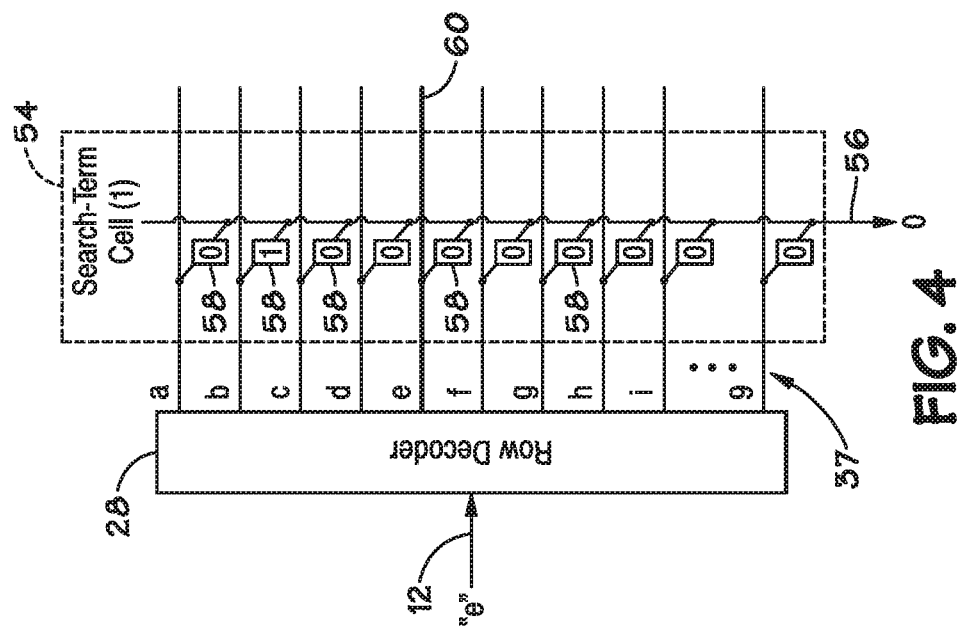

FIGS. 4 and 5 depict an example of the search-term cell 54 in operation. FIG. 4 illustrates the search-term cell 54 receiving a term that does not match the cell's search term, and FIG. 5 illustrates a match.

As illustrated by FIG. 4, the search-term cell 54 may be configured to search for one or more terms by storing data in the memory cells 58. The memory cells 58 may each represent a term that the data stream 12 might present, e.g., in FIG. 3, each memory cell 58 represents a single letter or number, starting with the letter "a" and ending with the number "9". Memory cells 58 representing terms that satisfy the search term may be programmed to store a first value, and memory cells 58 that do not represent terms that satisfy the search term may be programmed to store a different value. In the illustrated example, the search-term cell 54 is configured to search for the letter "b". The memory cells 58 that represent "b" may store a 1, or logic high, and the memory cells 58 that do not represent "b" may be programmed to store a 0, or logic low.

To compare a term from the data stream 12 with the search term, the row decoder 28 may select the input conductor 37 coupled to memory cells 58 representing the received term. In FIG. 4, the data stream 12 presents a lowercase "e". This term may be presented by the data stream 12 in the form of an eight-bit ASCII code, and the row decoder 28 may interpret this byte as a row address, outputting a signal on the conductor 60 by energizing it.

In response, the memory cell 58 controlled by the conductor 60 may output a signal indicative of the data that the memory cell 58 stores, and the signal may be conveyed by the output conductor 56. In this case, because the letter "e" is not one of the terms specified by the search-term cell 54, it does not match the search term, and the search-term cell 54 outputs a 0 value, indicating no match was found.

In FIG. 5, the data stream 12 presents a character "b". Again, the row decoder 28 may interpret this term as an address, and the row decoder 28 may select the conductor 62. In response, the memory cell 58 representing the letter "b" outputs its stored value, which in this case is a 1, indicating a match.

The search-term cells 54 may be configured to search for more than one term at a time. Multiple memory cells 58 may be programmed to store a 1, specifying a search term that matches with more than one term. For instance, the memory cells 58 representing the letters lowercase "a" and uppercase "A" may be programmed to store a 1, and the search-term cell 54 may search for either term. In another example, the search-term cell 54 may be configured to output a match if any character is received. All of the memory cells 58 may be programmed to store a 1, such that the search-term cell 54 may function as a wildcard term in a search criterion.

Figure 6:
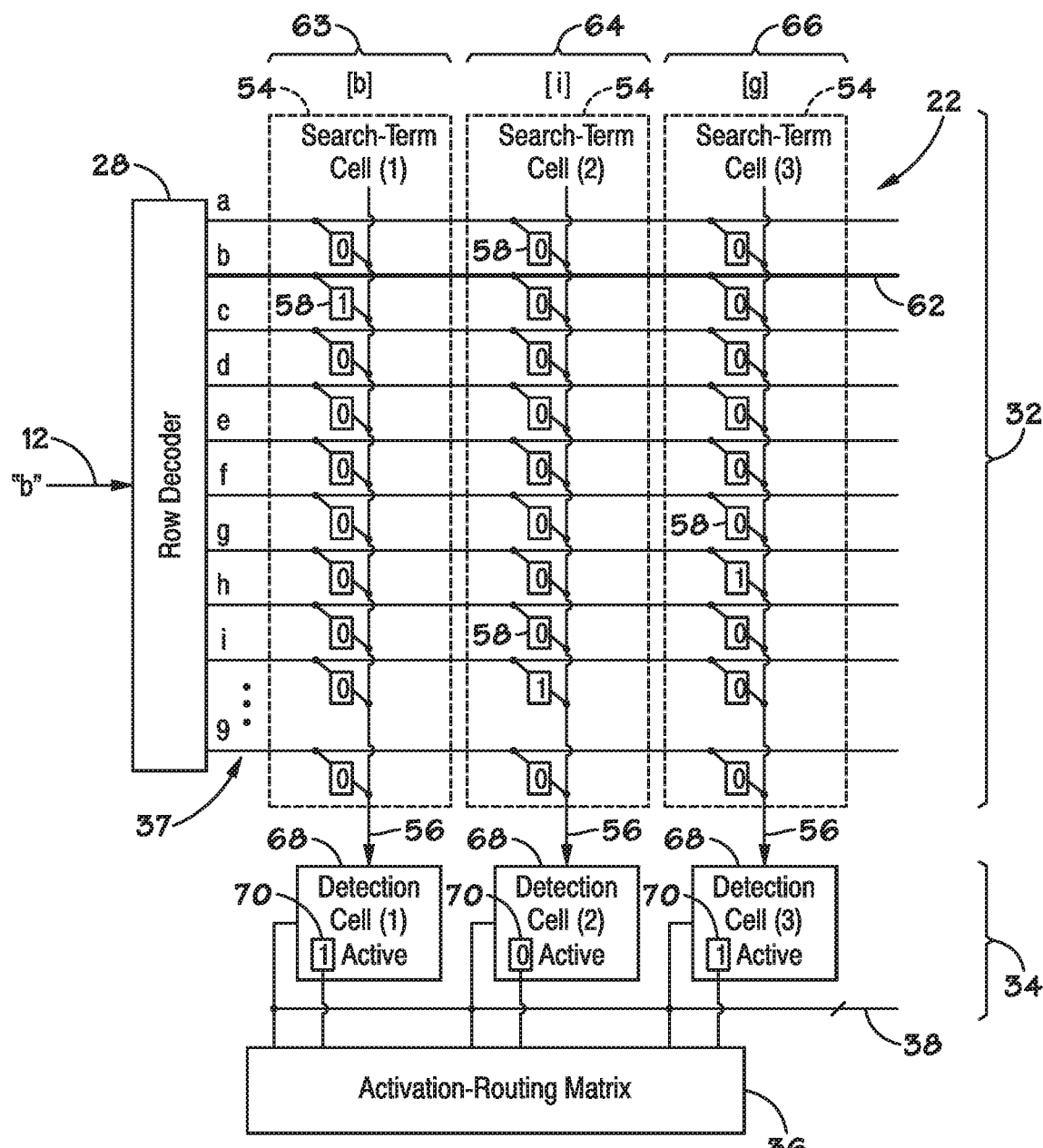
FIGS. 6-8 depict a recognition module including several search-term cells searching the data stream for a word.
Figure 7:
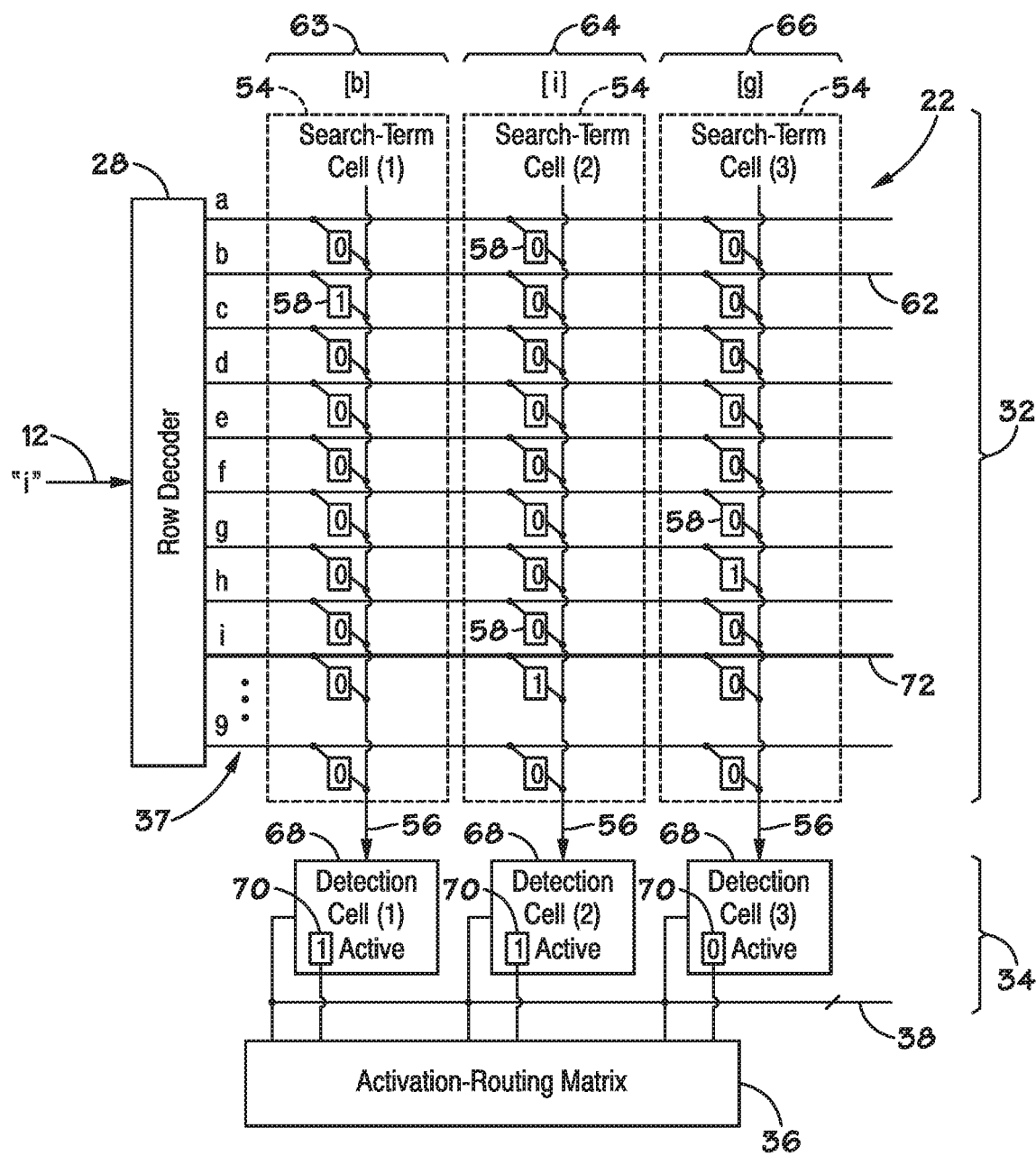
Figure 8:
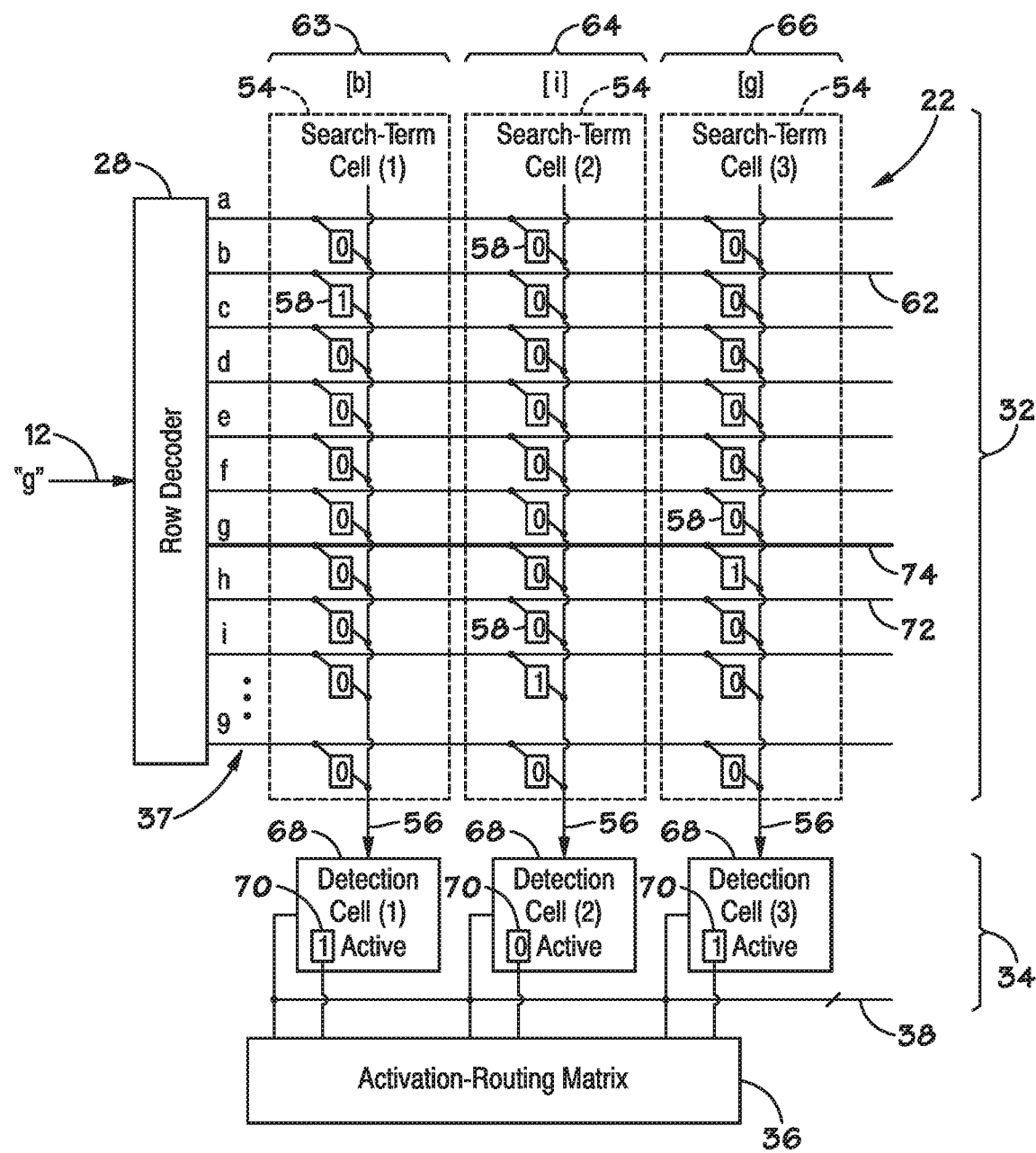

FIGS. 6-8 depict the recognition module 22 searching according to a multi-term search criterion, e.g., for a word. Specifically, FIG. 6 illustrates the recognition module 22 detecting the first letter of a word, FIG. 7 illustrates detection of the second letter, and FIG. 8 illustrates detection of the last letter.

As illustrated by FIG. 6, the recognition module 22 may be configured to search for the word "big". Three adjacent feature cells 63, 64, and 66 are illustrated. The feature cell 63 is configured to detect the letter "b". The feature cell 64 is configured to detect the letter "i". And the feature cell 66 is configured to both detect the letter "g" and indicate that the search criterion is satisfied.

FIG. 6 also depicts additional details of the detection array 34. The detection array 34 may include a detection cell 68 in each of the feature cells 63, 64, and 66. Each of the detection cells 68 may include a memory cell 70, such as one of the types of memory cells described above (e.g., a flip-flop), that indicates whether the feature cell 63, 64, or 66 is active or inactive. The detection cells 68 may be configured to output a signal to the activation-routing matrix 36 indicating whether the detection cell both is active and has received a signal from its associated search-term cell 54 indicating a match. Inactive features cells 63, 64, and 66 may disregard matches. Each of the detection cells 68 may include an AND gate with inputs from the memory cell 70 and the output conductor 56. The output of the AND gate may be routed to both the detection bus 38 and the activation-routing matrix 36, or one or the other.

The activation-routing matrix 36, in turn, may selectively activate the feature cells 63, 64, and 66 by writing to the memory cells 70 in the detection array 34. The activation-routing matrix 36 may activate feature cells 63, 64, or 66 according to the search criterion and which search term is being searched for next in the data stream 12.

In FIG. 6, the data stream 12 presents the letter "b". In response, each of the feature cells 63, 64, and 66 may output a signal on their output conductor 56, indicating the value stored in the memory cell 58 connected to the conductor 62, which represents the letter "b". The detection cells 56 may then each determine whether they have received a signal indicating a match and whether they are active. Because the feature cell 63 is configured to detect the letter "b" and is active, as indicated by its memory cell 70, the detection cell 68 in the feature cell 63 may output a signal to the activation-routing matrix 36 indicating that the first search term of the search criterion has been matched.

As illustrated by FIG. 7, after the first search term is matched, the activation-routing matrix 36 may activate the next feature cell 64 by writing a 1 to its memory cell 70 in its detection cell 68. The activation-routing matrix 36 may also maintain the active state of the feature cell 63, in case the next term satisfies the first search term, e.g., if the sequence of terms "bbig" is received. The first search term of search criteria may be maintained in an active state during a portion or substantially all of the time during which the data stream 12 is searched.

In FIG. 7, the data stream 12 presents the letter "i" to the recognition module 22. In response, each of the feature cells 63, 64, and 66 may output a signal on their output conductor 56, indicating the value stored in the memory cell 58 connected to the conductor 72, which represents the letter "i". The detection cells 56 may then each determine whether they have received a signal indicating a match and whether they are active. Because the feature cell 64 is configured to detect the letter "i" and is active, as indicated by its memory cell 70, the detection cell 68 in the feature cell 64 may output a signal to the activation-routing matrix 36 indicating that the next search term of its search criterion has been matched.

Next, the activation-routing matrix 36 may activate the feature cell 66, as illustrated by FIG. 8. Before evaluating the next term, the feature cell 64 may be deactivated. The feature cell 64 may be deactivated by its detection cell 68 resetting its memory cell 70 between detection cycles or the activation-routing matrix 36 may deactivate the feature cell 64, for example.

In FIG. 8, the data stream 12 presents the term "g" to the row decoder 28, which selects the conductor 74 representing the term "g". In response, each of the feature cells 63, 64, and 66 may output a signal on their output conductor 56, indicating the value stored in the memory cell 58 connected to the conductor 74, which represents the letter "g". The detection cells 56 may then each determine whether they have received a signal indicating a match and whether they are active. Because the feature cell 66 is configured to detect the letter "g" and is active, as indicated by its memory cell 70, the detection cell 68 in the feature cell 66 may output a signal to the activation routing matrix 36 indicating that the last search term of its search criterion has been matched.

The end of a search criterion or a portion of a search criterion may be identified by the activation-routing matrix 36 or the detection cell 68. These components 36 or 68 may include memory indicating whether their feature cell 63, 64, or 66 specifies the last search term of a search criterion or a component of a search criterion. For example, a search criterion may specify all sentences in which the word "cattle" occurs twice, and the recognition module may output a signal indicating each occurrence of "cattle" within a sentence to the aggregation module, which may count the occurrences to determine whether the search criterion is satisfied.

Feature cells 63, 64, or 66 may be activated under several conditions. A feature cell 63, 64, or 66 may be "always active", meaning that it remains active during all or substantially all of a search. An example of an always active feature cell 63, 64, or 66 is the first feature cell of the search criterion, e.g., feature cell 63.

A feature cell 63, 64, or 66 may be "active when requested", meaning that the feature cell 63, 64, or 66 is active when some condition precedent is matched, e.g., when the preceding search terms in a search criterion are matched. An example is the feature cell 64, which is active when requested by the feature cell 63 in FIGS. 6-8, and the feature cell 66, which active when requested by the feature cell 64.

A feature cell 63, 64, or 66 may be "self activated", meaning that once it is activated, it activates itself as long as its search term is matched. For example, a self activated feature cell having a search term that is matched by any numerical digit may remain active through the sequence "123456xy" until the letter "x" is reached. Each time the search term of the self activated feature cell is matched, it may activate the next feature cell in the search criterion. Thus, an always active feature cell may be formed from a self activating feature cell and an active when requested feature cell: the self activating feature cell may be programmed with all of its memory cells 58 storing a 1, and it may repeatedly activate the active when requested feature cell after each term. In some embodiments, each feature cell 63, 64, and 66 may include a memory cell in its detection cell 68 or in the activation-routing matrix 36 that specifies whether the feature cell is always active, thereby forming an always active feature cell from a single feature cell.

Figure 9:
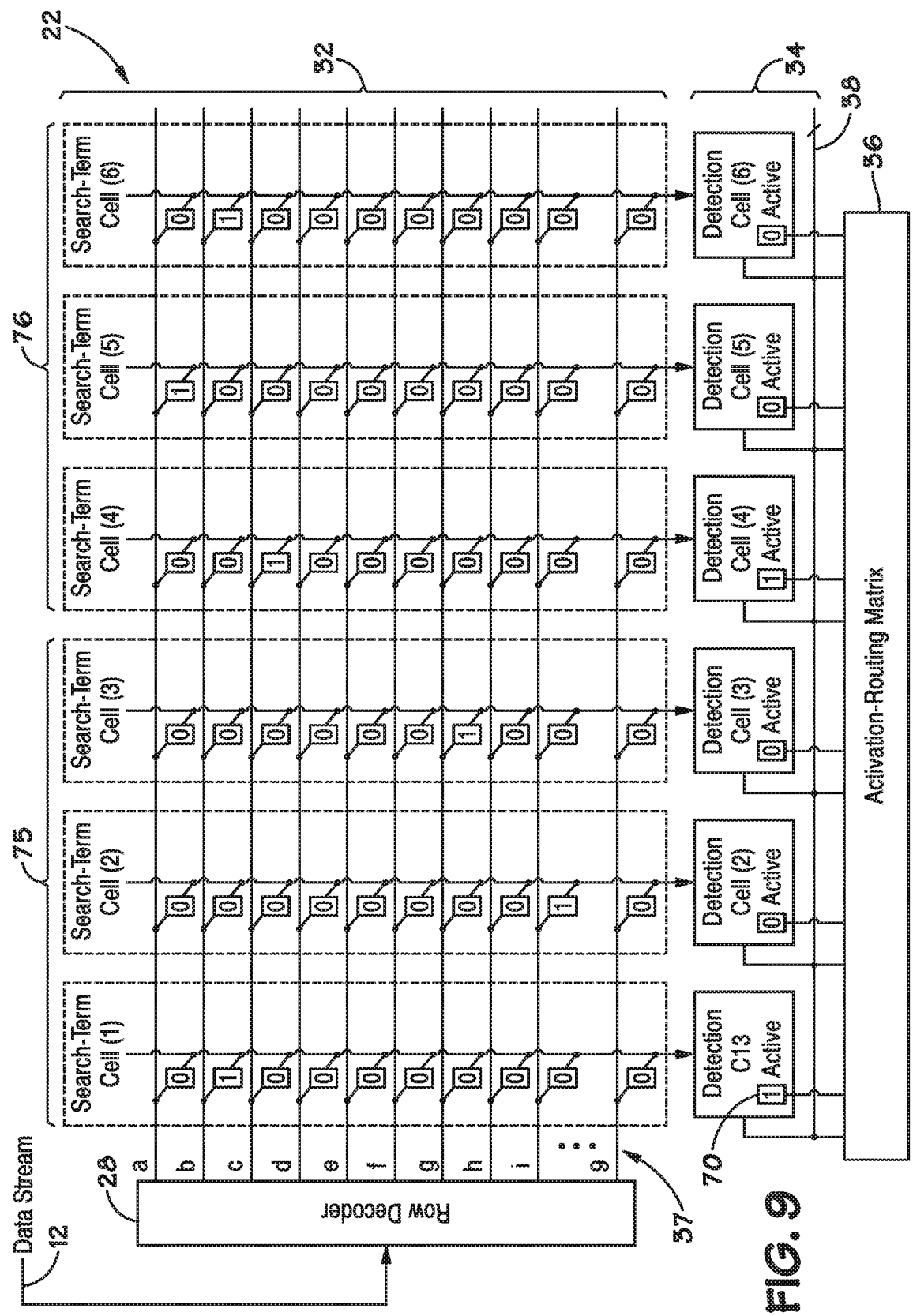
FIG. 9 depicts the recognition module configured to search the data stream for two words in parallel.

FIG. 9 depicts an example of a recognition module 22 configured to search according to a first search criterion 75 and a second search criterion 76 in parallel. In this example, the first search criterion 75 specifies the word "big", and the second search criterion 76 specifies the word "cab". A signal indicative of the current term from the data stream 12 may be communicated to feature cells in each search criterion 75 and 76 at generally the same time. Each of the input conductors 37 spans both of the search criteria 75 and 76. As a result, in some embodiments, both of the search criteria 75 and 76 may evaluate the current term generally simultaneously. This is believed to speed the evaluation of search criteria. Other embodiments may include more feature cells configured to evaluate more search criteria in parallel. For example, some embodiments may include more than 100, 500, 1000, 5000, or 10,000 feature cells operating in parallel. These feature cells may evaluate hundreds or thousands of search criteria generally simultaneously.

Search criteria with different numbers of search terms may be formed by allocating more or fewer feature cells to the search criteria. Simple search criteria may consume fewer resources in the form of feature cells than complex search criteria. This is believed to reduce the cost of the pattern-recognition processor 14 (FIG. 2) relative to processors with a large number of generally identical cores, all configured to evaluate complex search criteria.

Figure 10:
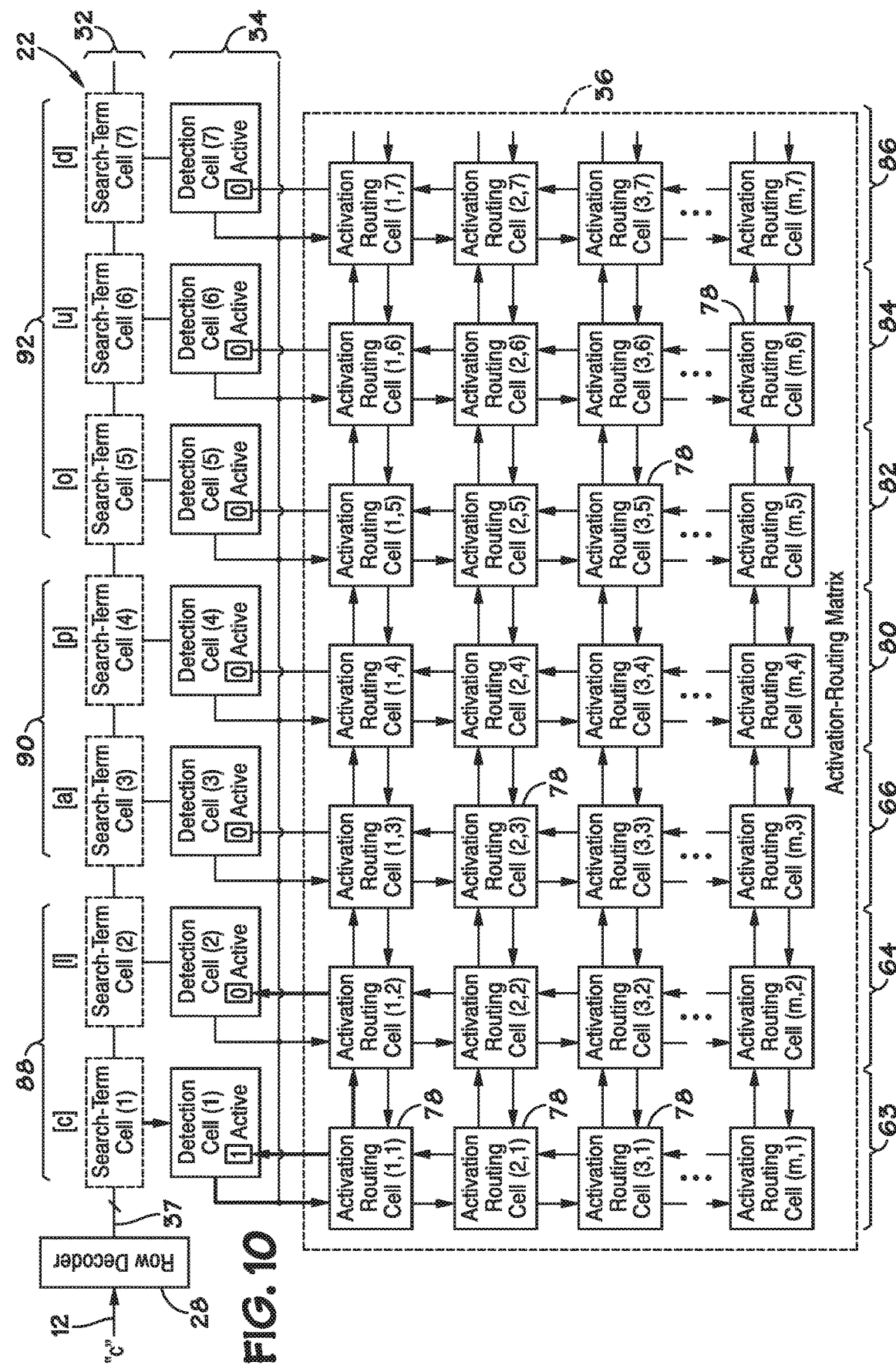
FIGS. 10-12 depict the recognition module searching according to a search criterion that specifies multiple words with the same prefix.
Figure 11:
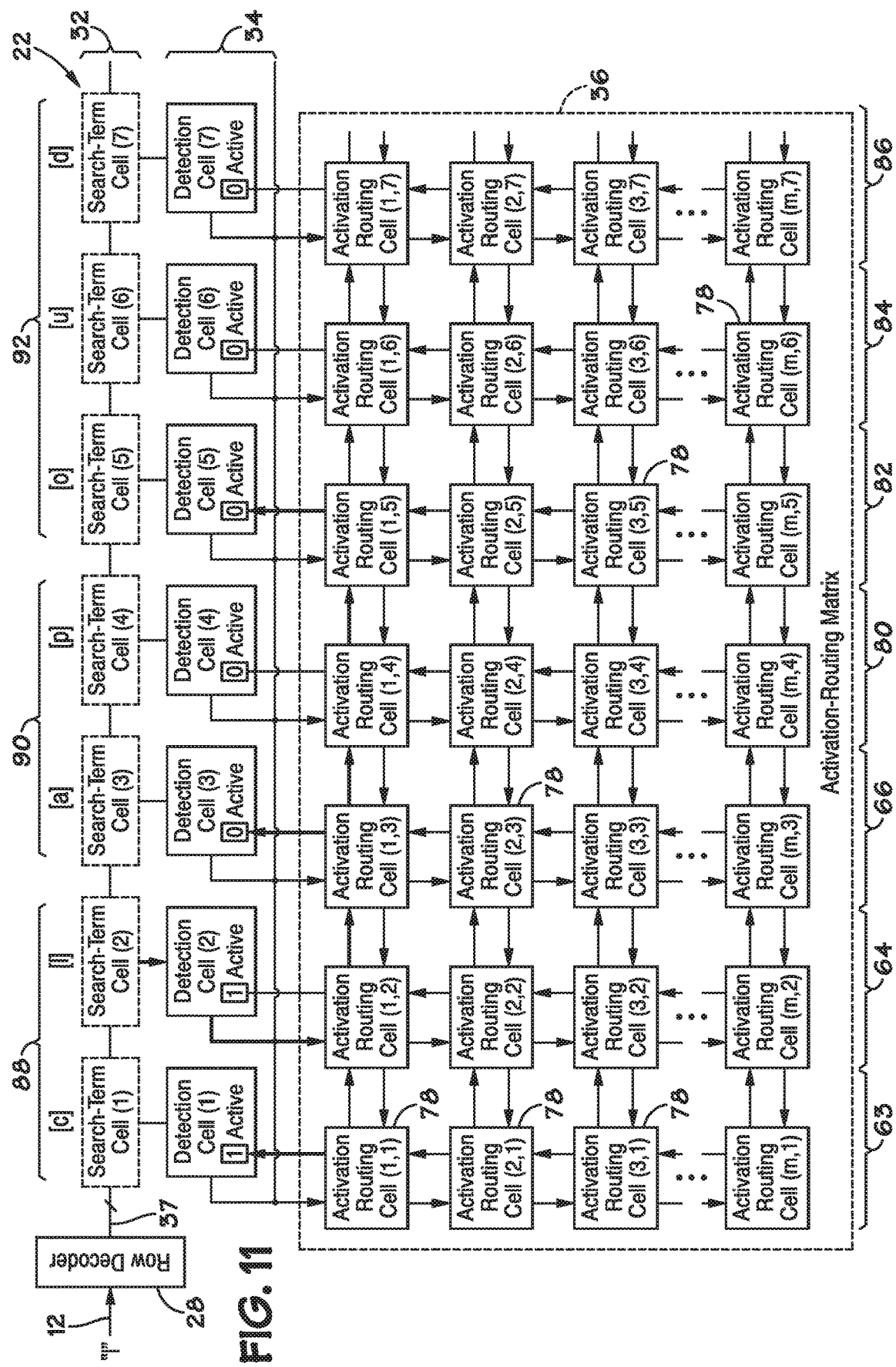
Figure 12:
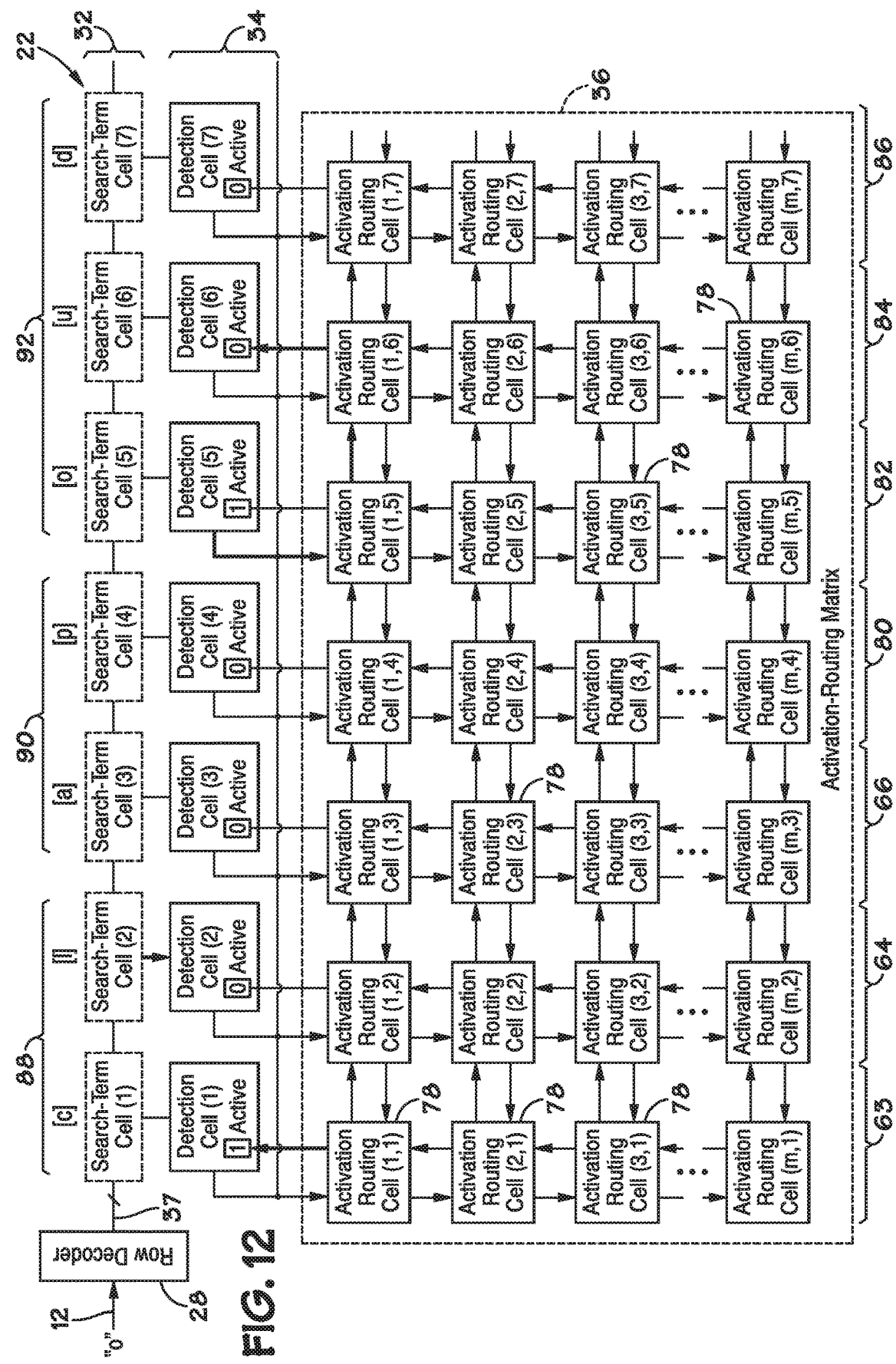

FIGS. 10-12 depict both an example of a more complex search criterion and features of the activation-routing matrix 36. The activation-routing matrix 36 may include a plurality of activation-routing cells 78, groups of which may be associated with each of the feature cells 63, 64, 66, 80, 82, 84, and 86. For instance, each of the feature cells may include 5, 10, 20, 50, or more activation-routing cells 78. The activation-routing cells 78 may be configured to transmit activation signals to the next search term in a search criterion when a preceding search term is matched. The activation-routing cells 78 may be configured to route activation signals to adjacent feature cells or other activation-routing cells 78 within the same feature cell. The activation-routing cells 78 may include memory that indicates which feature cells correspond to the next search term in a search criterion.

As illustrated by FIGS. 10-12, the recognition module 22 may be configured to search according to complex search criteria than criteria that specify single words. For instance, the recognition module 22 may be configured to search for words beginning with a prefix 88 and ending with one of two suffixes 90 or 92. The illustrated search criterion specifies words beginning with the letters "c" and "l" in sequence and ending with either the sequence of letters "ap" or the sequence of letters "oud". This is an example of a search criterion specifying multiple target expressions, e.g., the word "clap" or the word "cloud".

In FIG. 10, the data stream 12 presents the letter "c" to the recognition module 22, and feature cell 63 is both active and detects a match. In response, the activation-routing matrix 36 may activate the next feature cell 64. The activation-routing matrix 36 may also maintain the active state of the feature cell 63, as the feature cell 63 is the first search term in the search criterion.

In FIG. 11, the data stream 12 presents a letter "l", and the feature cell 64 recognizes a match and is active. In response, the activation-routing matrix 36 may transmit an activation signal both to the first feature cell 66 of the first suffix 90 and to the first feature cell 82 of the second suffix 92. In other examples, more suffixes may be activated, or multiple prefixes may active one or more suffixes.

Next, as illustrated by FIG. 12, the data stream 12 presents the letter "o" to the recognition module 22, and the feature cell 82 of the second suffix 92 detects a match and is active. In response, the activation-routing matrix 36 may activate the next feature cell 84 of the second suffix 92. The search for the first suffix 90 may die out, as the feature cell 66 is allowed to go inactive. The steps illustrated by FIGS. 10-12 may continue through the letters "u" and "d", or the search may die out until the next time the prefix 88 is matched.

Figure 13:
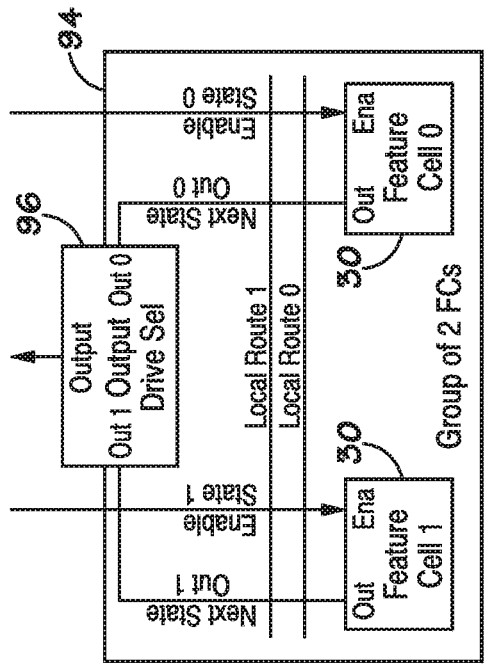
FIGS. 13-16 depict a hierarchical arrangement of feature cells of a pattern-recognition processor in accordance with an embodiment of the present invention.

Embodiments of the pattern recognition processor 14 may include any arrangement of feature cells 30. FIGS. 13-16 depict a hierarchical arrangement of feature cells 30 in accordance with an embodiment of the present invention. In one embodiment, as depicted in FIG. 13, a first level of a hierarchy may include the feature cells 30 arranged in groups 94 of two feature cells 30, Feature Cell 1 and Feature Cell 0. Each feature cell 30 may receive an input, e.g., an Enable State signal, and may output a Next State signal to another group of feature cells. Each feature cell 30 in the group 94 may be coupled to an output drive select 96 that provides an output from the group 94 based on the outputs of each feature cell 30. For example, in one embodiment, the output drive select 96 may be configured to output a Next State Out "0" signal, a Next State Out "1" signal, or the logical OR of the two Next State Out signals received from the feature cells 30.

Figure 14:
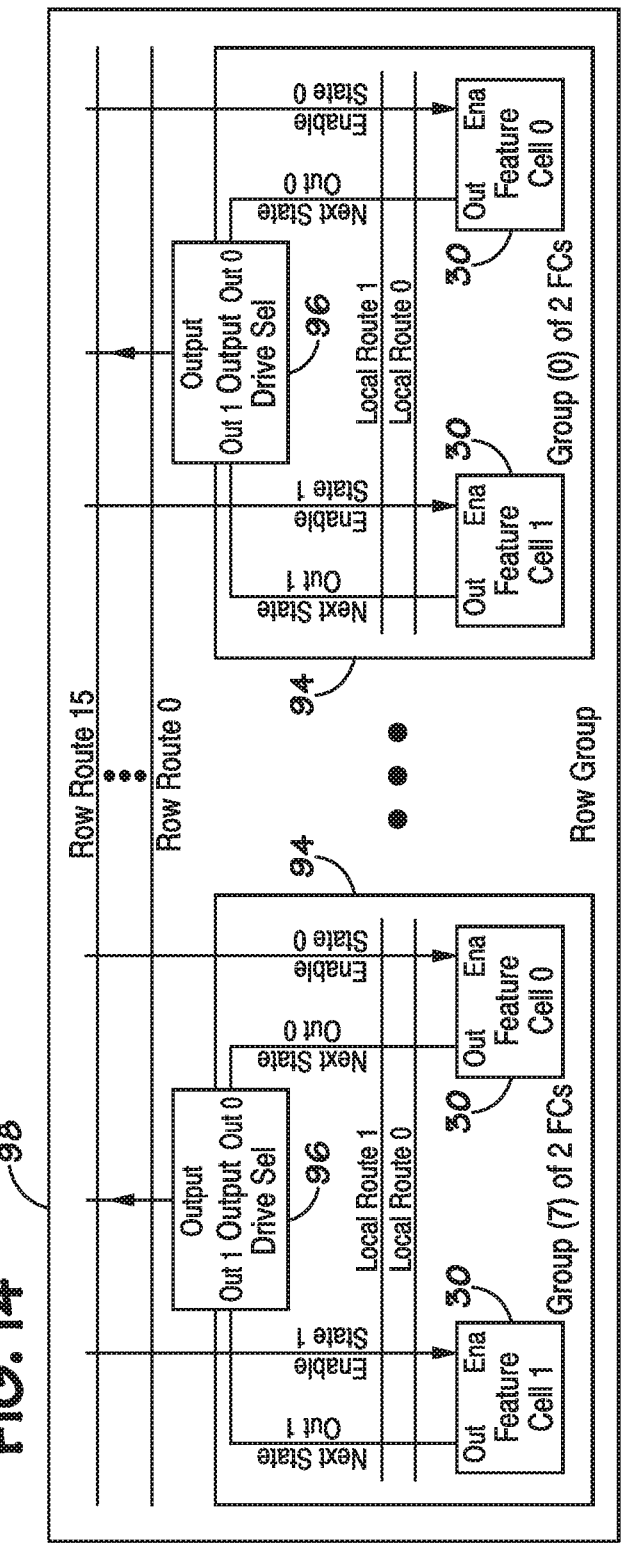

As shown in FIG. 14, a second hierarchical level may include each group 94 of feature cells arranged in a row 98 of groups 94. Each row 98 may include any number of groups 94 of feature cells 30. For example, in the embodiment shown in FIG. 14, the row 98 may include eight groups 94 of two feature cells 30, e.g. Group 0 through Group 7.

Figure 15:
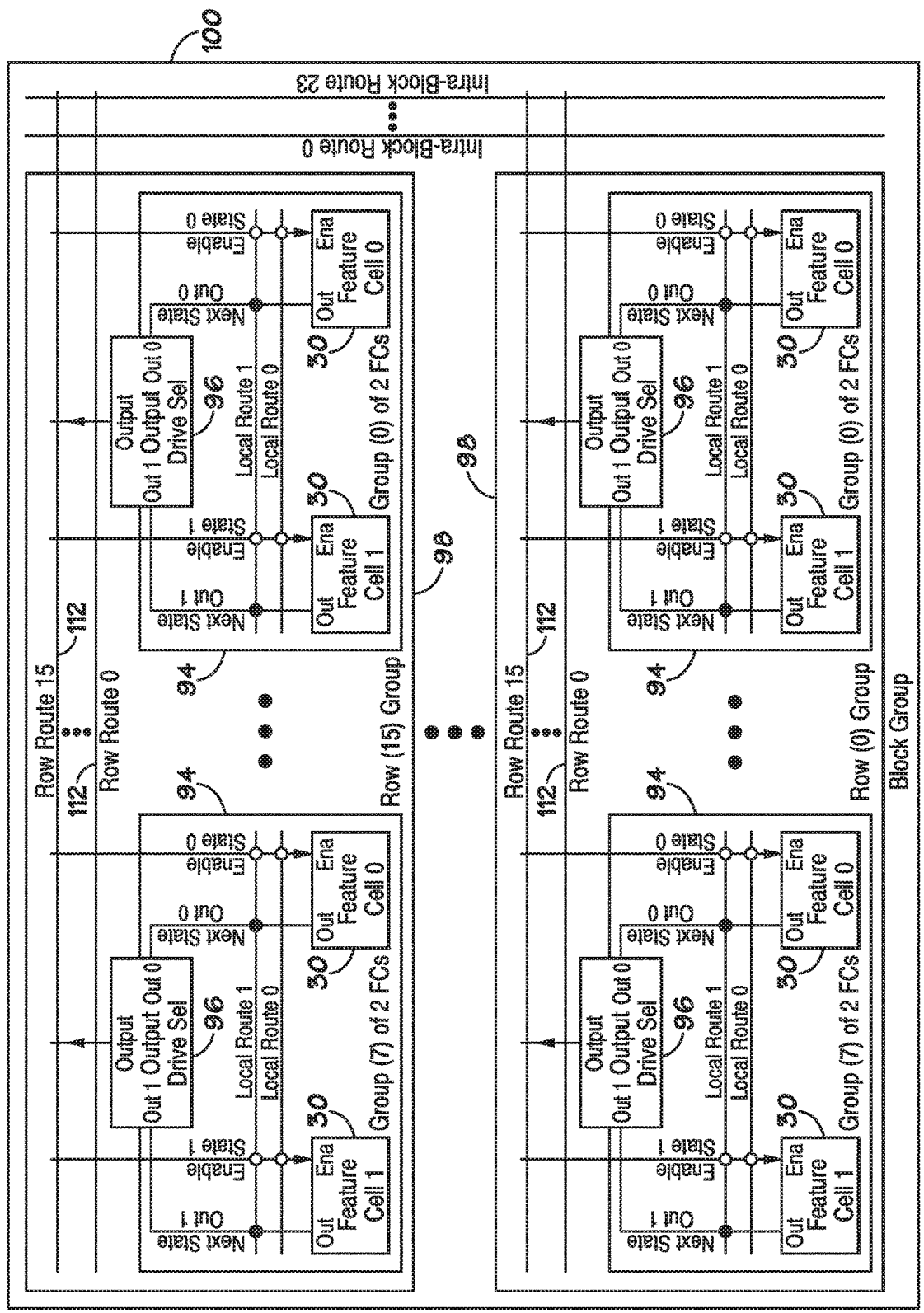
Figure 16:
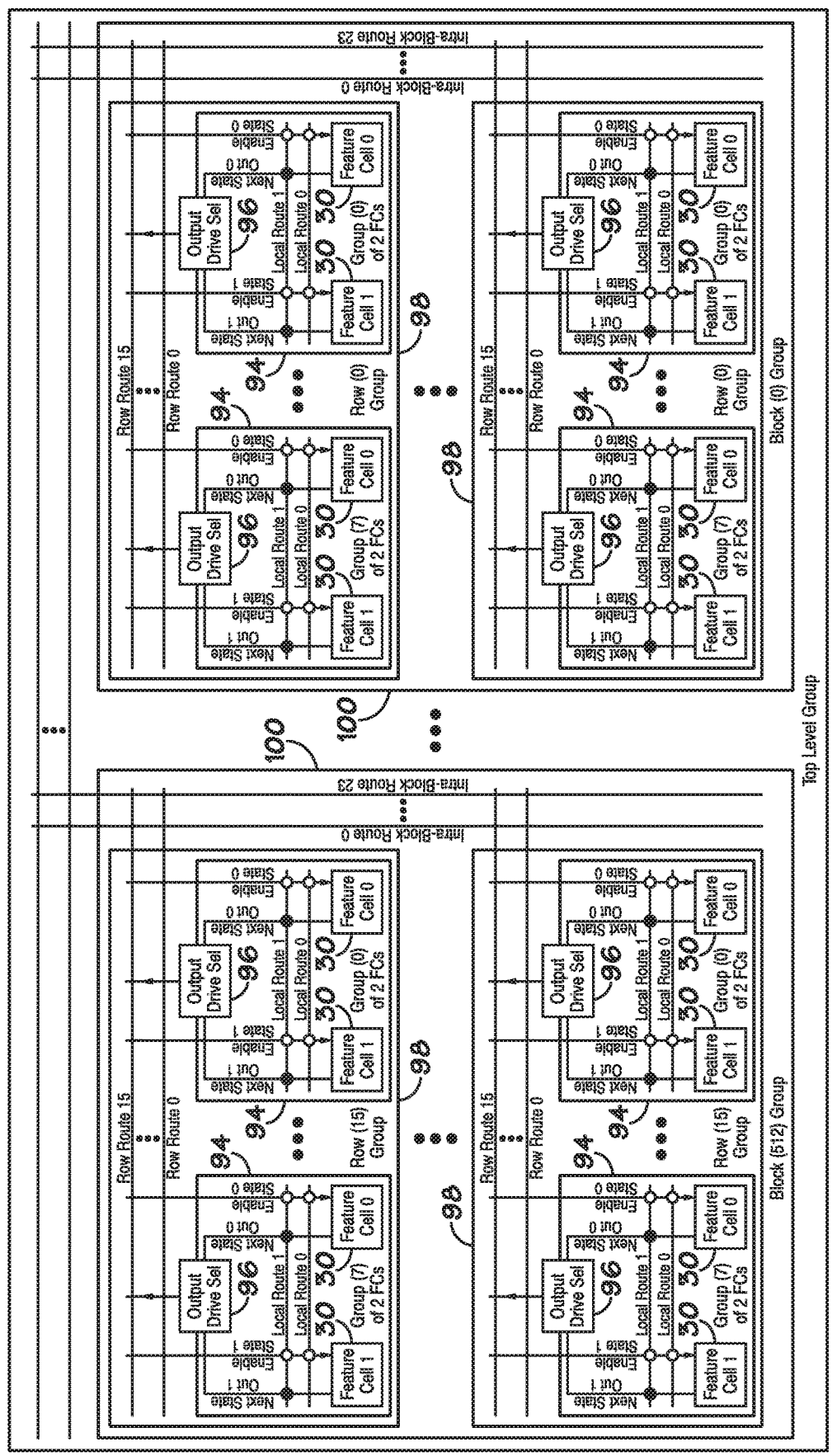

As shown in FIG. 15, a third level of a hierarchy may include multiple rows 98 grouped into blocks 100, wherein each block 100 includes one or more rows 98. In one embodiment of the processor 14, each block 100 may include 16 rows 98, e.g., Row 0 through Row 15. The pattern-recognition processor 14 may then include any number of blocks 100 for implementing the programmed state machines and pattern searching described above. As shown in FIG. 16, in one embodiment the pattern-recognition processor 14 may include 512 blocks, e.g., Block 0 through Block 512.

The groups 94, rows 98, and blocks 100 illustrated above describe a hierarchical arrangement of the feature cells. A programmed state machine may include any number of feature cells 30. Thus, each group, row, or block may include multiple programmed state machines. During operation of the pattern-recognition processer 14, such as during the search cycle described above, each state of a programmed state machine (e.g., one or more feature cells) is routed to the next state of the programmed state machine (referred to as "next state routing"), by the Next State signals output from each feature cell 30 and selected by the output drive select 96 of each group 94.

FIGS. 17-21 describe a multi-level hierarchical routing matrix that provides next state routing, programmability, and high throughput, in accordance with an embodiment of the present invention. As used herein, the term "routing matrix" refers to a plurality of connections for routing communications between components of the pattern-recognition processor 14. The "routing matrix" described below can be functionally distinct from the matrices described above in FIGS. 1-12. As described further below, the routing matrix can provide for programmable and/or non-programmable connections at, in, and between every level of the hierarchy of the pattern-recognition processor 14 described above. The connections may connect routing lines between feature cells, groups, rows, and blocks of the pattern-recognition processor 14. The connections may include, but are not limited to, the following types of connections: programmable and non-programmable; uni-directional and bi-directional; logical combinations (OR, AND, XOR, etc.); selectors (e.g., one of many); and isolators (break connections to a line). A programmable connection may be configured to perform any of the functionality listed above. For example, a programmable connection may be programmed as uni-directional, bi-directional, any logical combination, selector, isolator, etc. A non-programmable connection may perform any of the functionality described above, but is incapable of being programmed with a different functionality.

The connections in FIGS. 17-21 are depicted by connection symbols summarized below in Table 1:

TABLE 1

| Symbol | Connections Description |
|---|---|
| ● | Non-programmable "$1^{st}$ level" output connection |
| ○ | Programmable "$1^{st}$ level" input connection |
| ◻ | Programmable "$2^{nd}$ level" input connection |
| ▫ | Programmable "$2^{nd}$ level" output connection |
| ▽ | Programmable "$3^{rd}$ level" connection |
| ⌂ | Programmable "$4^{th}$ level" connection |

Figure 17:
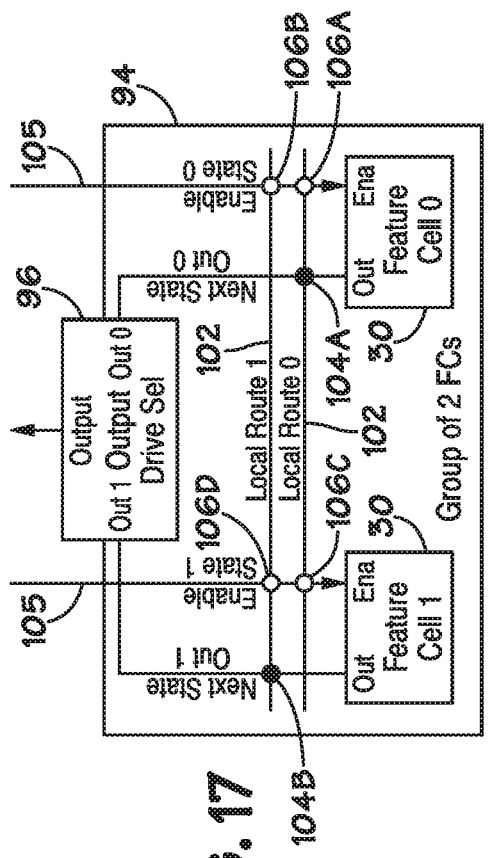
FIGS. 17-20 depict a multi-level hierarchical routing matrix of a pattern-recognition processor in accordance with an embodiment of the present invention.

FIG. 17 depicts a hierarchy level that includes the group 94 of feature cells 30 described above in FIG. 13 and in accordance with an embodiment of the present invention. As mentioned above, each feature cell 30 may receive an input that enables the feature cell as the next state. As also mentioned above, based on the pattern matching executed against the search criteria programmed in the feature cells 30, the feature cell 30 may generate an output that enables the next active state (next state signal).

The routing of the input and output signals of the feature cells 30 are determined by the connections. The feature cells 30 of the group 94 may be interconnected by local route lines 102 (Local Route 0 and Local Route 1). The outputs of the feature cells 30 of the group 94 are coupled to the local route lines 102 and the output drive select 96 by output connections 104. For example, Feature Cell 0 is coupled to Local Route Line 0 by a first output connection 104A and Feature Cell 1 is coupled to Local Route Line 1 by a second output connection 104B. As depicted in FIG. 17, in one embodiment, the output connections are non-programmable "$1^{st}$ Level" connections. In such an embodiment, the connections 104 are not removable and are not configurable. In other embodiments, the output connections 104 may be programmable.

The output drive select 96 may be programmed to drive any number or type of signals from the received outputs of the feature cells 30. As mentioned above, in one embodiment, the output drive select 96 may be configured to output one of three possible logical outputs: "Next State Out 0"; "Next State Out 1"; or the logical OR of the two Next State Out signals. In other embodiments, the output drive select 96 may be configured to output other logical combinations, such as AND, NOR and/or XOR.

The local route lines 102 may be coupled to the inputs 105 (which may represent one or more input signals) of the feature cells 30, by input connections 106. For example, the Feature Cell 0 may be coupled to Local Route Lines 0 and 1 by input connections 106A and 106B respectively. Similarly, Feature Cell 1 may be coupled to Local Route Line 0 and Local Route Line 1 by input connections 106C and 106D respectively. As depicted in FIG. 17, the input connections 106 may be programmable "1$^{st}$ Level" connections. In such an embodiment, the input connections 106 may be configured to provide a logical OR of any of the connected inputs 105.

Figure 18:
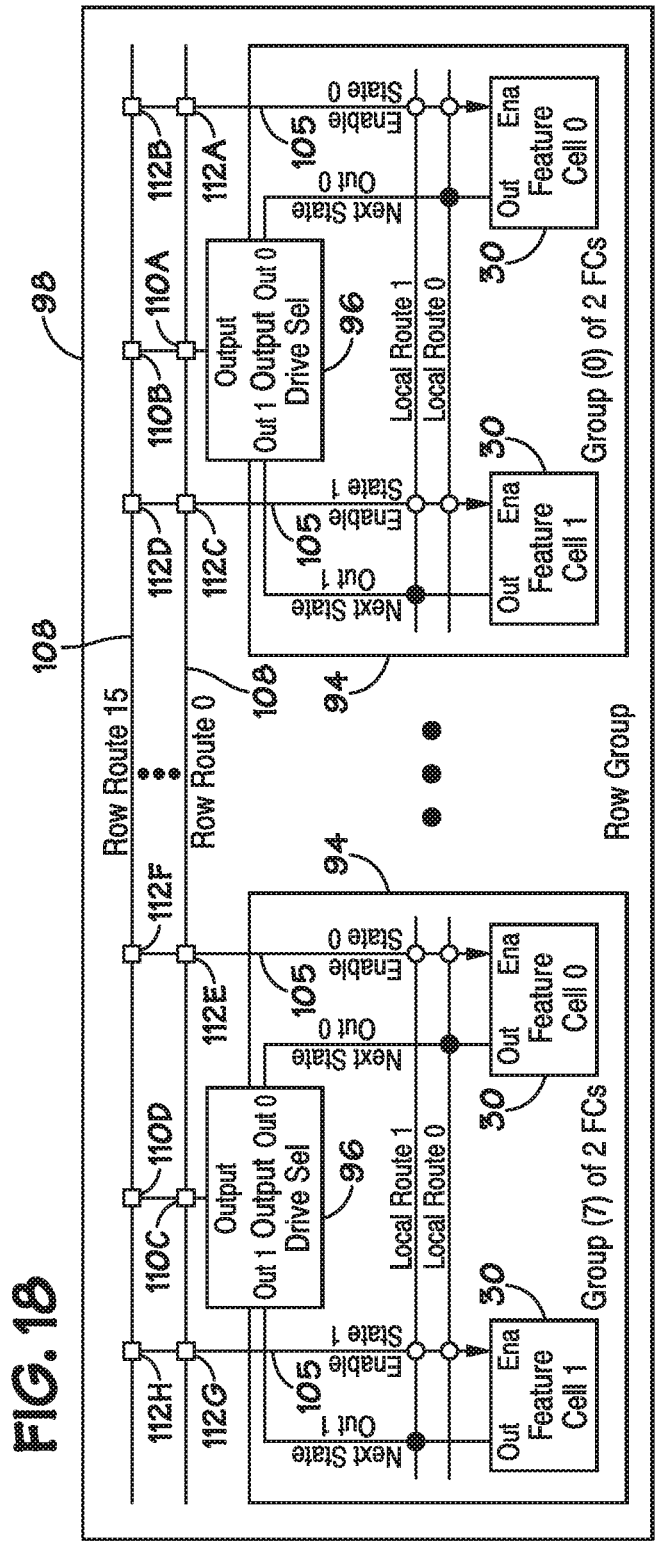

FIG. 18 depicts a hierarchy level having the row 98 of the groups 94 as described above in FIG. 14 and in accordance with an embodiment of the present invention. As mentioned above, each row 98 may include any number of groups 94 of feature cells 30, e.g., Group 0 through Group 7 shown in FIG. 18. The groups of the row 98 may be interconnected by row route lines 108. In one embodiment, row route lines 108 may be provided for each row of the block 100. Thus, in an embodiment having 16 rows 98 per block 100, 16 row route lines may be provided, e.g., Row Route line 0 through Row Route line 15.

The outputs from the output drive selects 96 of each group 94 may be coupled to each row route line 108 by output connections 110. In one embodiment, the output connections may be programmable "2$^{nd}$ level" connections. As shown in FIG. 18, for example, Group 0 may be coupled to the row route lines 0 and 15 by output connections 110A and 110B respectively. Group 7 may be coupled to the row route lines 0 and 15 by output connections 110C and 110D respectively. All other row route lines (not shown) may be coupled to the output drive selects of Groups 0 through Group 7 by output connections 110. The output connections 110 may be configured to enable the output drive select 96 of a group 94 to drive or not drive a particular row route line 108.

Figure 19:
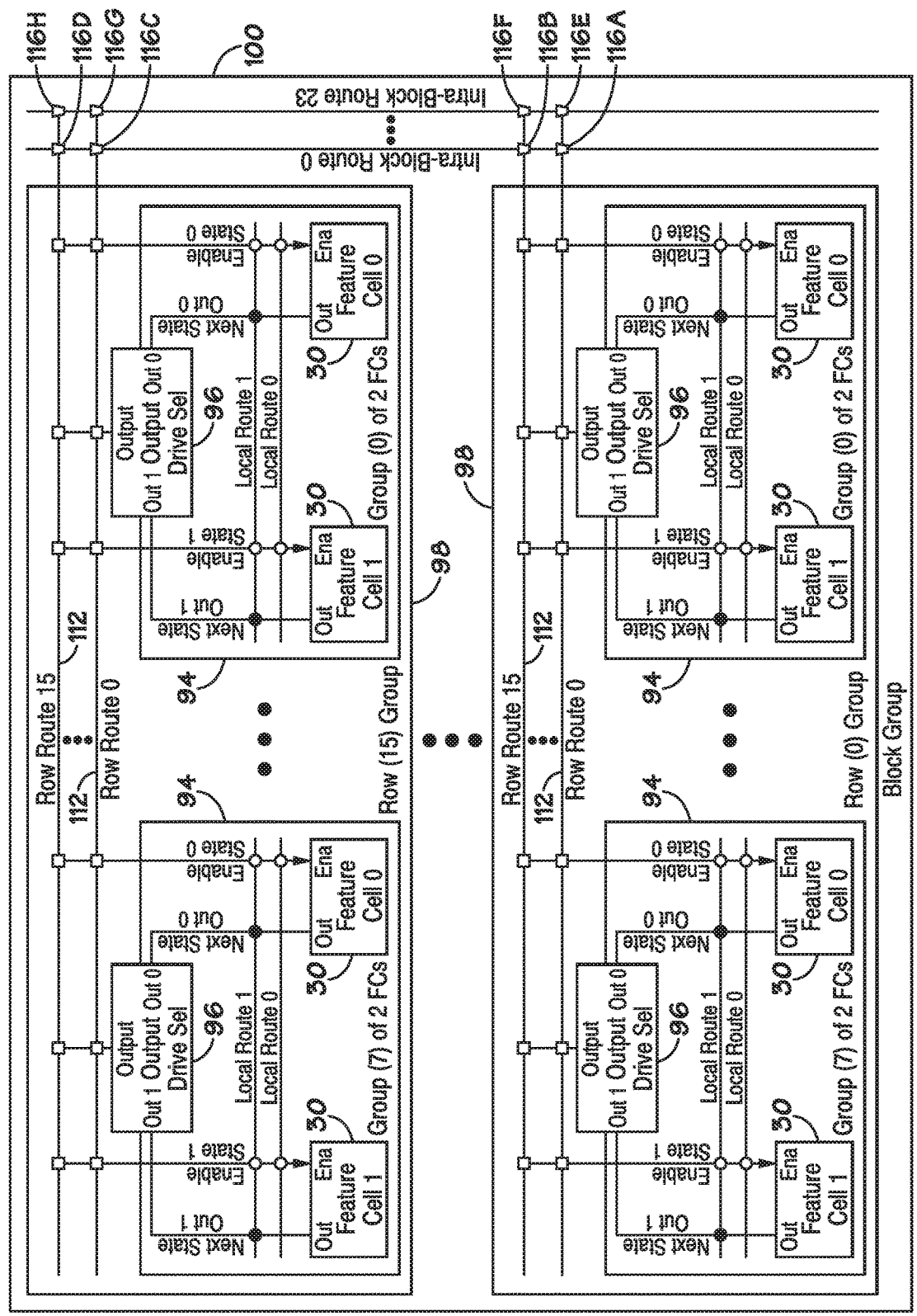

Additionally, the row route lines 108 may be coupled to the inputs 105 of each feature cell 30 by input connections 112. In one embodiment, the input connections 112 may be programmable "2$^{nd}$ level" connections. For example, the row route lines 108 may be coupled to the inputs of Feature Cell 0 of Group 0 by input connections 112A and 112B, and the row route lines 108 may be coupled to the inputs of Feature Cell 1 of Group 0 by input connections 112C and 112D. Similarly, as also shown in FIG. 18, the row route lines 108 may be coupled to the inputs of Feature Cell 0 of Group 7 by input connections 112E and 112F, and the row route lines 108 may be coupled to Feature Cell 1 of Group 7 by input connections 112G and 112H. Other row route lines (not shown) may be coupled to the inputs of each feature cell 30 of each group 94 of the row 98. In such an embodiment, the input connections 112 may be programmed to be a logical OR of any connected inputs to the feature cells 30. In other embodiments, the connections may be non-programmable and/or bi-directional connections Next, FIG. 19 depicts a hierarchy level of a block 100 having multiple rows 98 as described above in FIG. 15 and in accordance with an embodiment of the present invention. As described above, the block 100 may include any number of rows 98, e.g., Row 0 through Row 15. The rows 98 of the block 100 may be connected by intra-block route lines 114. The intra-block route lines 114 may be coupled to the row route lines 112 by bi-directional connections 116. In one embodiment, the bi-directional connections may be programmable "3$^{rd}$ level" connections. For example, intra-block line route line 0 may be coupled to Row Route line 0 of Row 0 by bi-directional connection 116A and Row Route line 15 of Row 0 by bi-directional connection 116B. Intra-block line route line 0 may be coupled to Row Route line 0 of Row 15 by bi-directional connections 116C and Row Route line 15 of Row 15 by bi-directional connection 116D. Similarly, intra-block route line 23 may be coupled to Row Route line 0 of Row 0 by bi-directional connection 116E and Row Route line 15 of Row 0 by bi-directional connection 116F. Further, as also shown in FIG. 19, intra-block route line 23 may be coupled to Row Route line 0 of Row 15 by bi-directional connections 116G and Row Route line 15 of Row 15 by bi-directional connection 116H. Other intra block lines (not shown) may be coupled to each row route line 116 of each row 98 by bi-directional connections 116.

As described above, the bi-directional connections 116 may be programmable. Thus, the bi-directional connections 116 may be programmed to enable one or more of the intra-block route lines 114 to drive a respective row route line 112 or to enable one or more row route lines 112 to drive a respective intra block route line 114. Each bi-directional connection 116 may be individually programmed, enabling configuration of connections between row route lines 112 and intra-block route lines 114 on a line-by-line basis. In other embodiments, the connections may be non-programmable and/or uni-directional connections.

Figure 20:
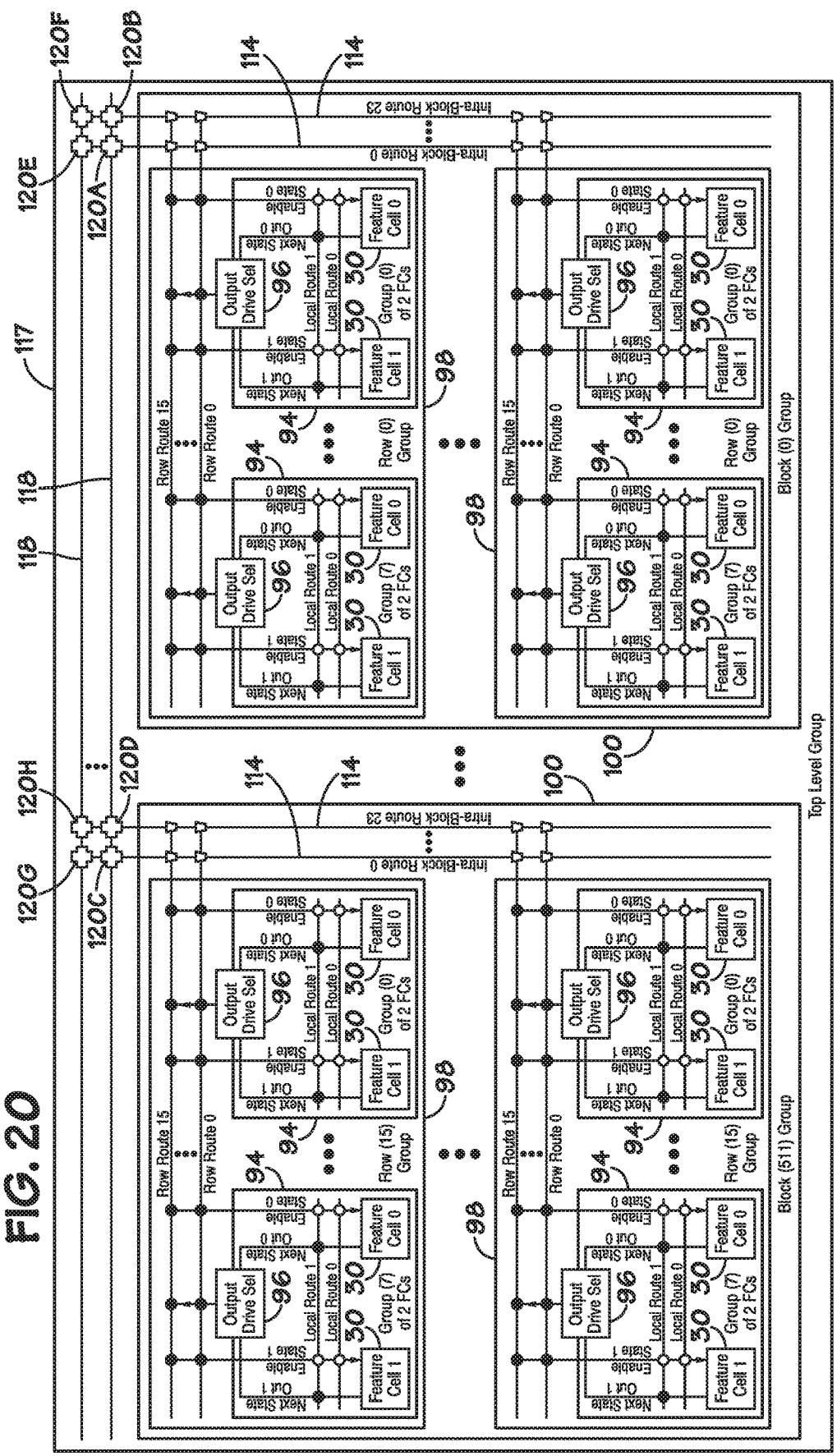

FIG. 20 depicts a top hierarchy level 117 of the routing matrix having blocks 100 in accordance with an embodiment of the present invention. In one embodiment, as shown in FIG. 20, the top level 117 may include 512 blocks 100, e.g., Block 0 through Block 511. The blocks 100 may be interconnected by top level route lines 118. The top level route lines 118 may be connected to the intra-block route lines 114 by bi-directional connections 120. Thus, as shown in FIG. 20, top level route line 0 may be coupled to intra-block route line 0 and intra-block route line 23 of Block 0 by bi-directional connections 120A and 120B respectively. Similarly, top level route line 0 may be coupled to intra-block line 0 and intra-block line 23 of Block 511 by bi-directional connections 120C and 120D respectively. As shown in FIG. 20, top level route line 23 may be coupled to intra-block route line 0 and intra-block route line 23 of Block 0 by bi-directional connections 120E and 120F respectively. Further, top level route line 23 may be coupled to intra-block line 0 and intra-block line 23 of Block 511 by bi-directional connections 120G and 120H respectively. All other top level route lines (not shown) may be coupled to the intra-block lines 114 of the blocks 100 by bi-directional connections 120.

As shown in FIG. 20, the bi-directional connections 120 may be programmable "4$^{th}$ level connections." The bi-directional connections may be programmed to enable one or more intra-block route lines 114 to drive a respective top level route line 118 or to enable one or more top level route lines 118 to drive a respective intra-block route line 114. Thus, the connections 120 may be programmed and configured on a line-by-line basis. In other embodiments, the connections may be non-programmable and/or uni-directional connections Advantageously, the multi-level hierarchical routing matrix described above may provide regularity of the programmability of the device, implementation of redundancy for improvements in production and manufacturing yields, changeability for different applications, and easier visualization and implementation of logic changes.

Figure 21:
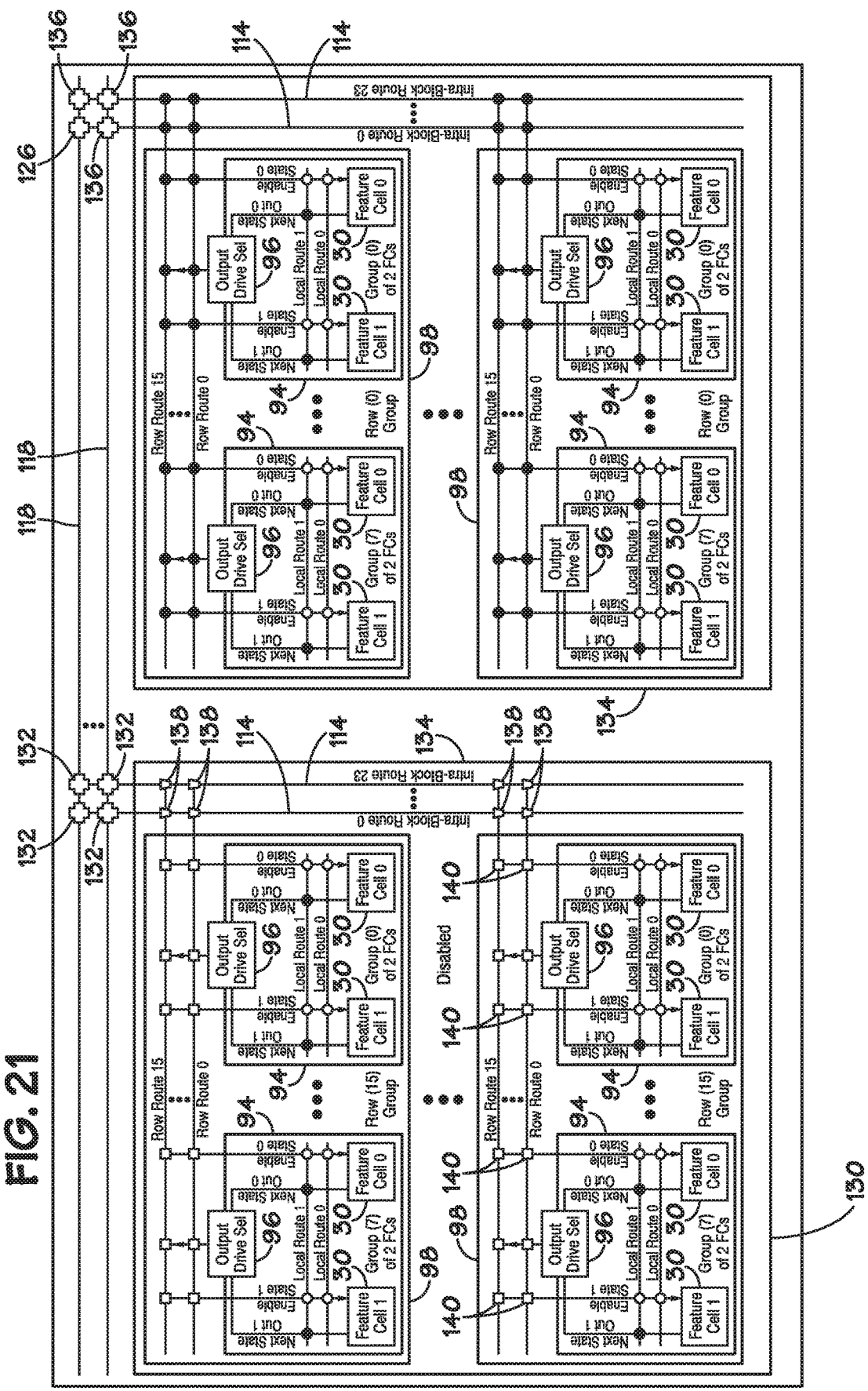
FIG. 21 depicts disabling of a portion of the feature cells of a pattern-recognition processor in accordance with an embodiment of the present invention.

As mentioned above, the connections may be isolators that are capable of "breaking" a line such that no signals are routed over a line, enabling a redundant section of the pattern-recognition processor 14 to be disabled. FIG. 21 depicts isolation of one or more feature cells 30 of the pattern-recognition processor 14 in accordance with an embodiment of the present invention. For example, the pattern-recognition processor 14 may include a block 130 of feature cells 30 that provide more capacity than used by the pattern-recognition processor 14. That is, during manufacture, to increase yields a pattern-recognition processor 14 may be manufactured with excess memory capacity (excess feature cells 30) than specified for the function of the processor 14. During manufacturing and testing of the processor 14, the excess feature cells 30 may be "disabled" by removing the feature cells available for the programmed state machines used by the processor 14. Some embodiments may not use all of the blocks of feature cells 30. In such embodiments, the unused blocks may be disabled. Disabled blocks may not be "activated" and/or "powered-up," and may not be refreshed during refresh cycles.

The block 130 may be coupled to the other portions of the pattern-recognition processor 14 by the connections 132 between the top level route lines and the intra-block route lines. In such an embodiment, the connections 132 may be programmable "4$^{th}$ level connections" that may be programmed to any desired functionality. Accordingly, if block 130 provides excess capacity, the connections 132 may be programmed to isolate block 130 from the rest of the route lines. Thus, the connection between the top level route lines 118 and the intra-block routing lines 114 may be "broken" by the programmable connections 132. Block 130 may be referred to as "disabled." In addition, unused block 130 may be "powered down," such as by setting an appropriate programming bit, in the block 130.

In contrast, other blocks that are used to provide memory capacity for programmed state machines of the pattern-recognition processor 14 may be accessible through the top level route lines 118 and intra-block route lines 114. For example, as shown in FIG. 21, block 134 is also connected to the same top level route lines 118 as disabled block 132, by connections 136. As shown in FIG. 21, the connections 136 may be programmable 4$^{th}$ level connections. However, the connections 136 may be programmed to enable access to the memory capacity provided by block 134, such as by allowing the top level route lines to drive the intra-block route lines or vice-versa. In other embodiments, feature cells 30 may be disabled at the row level, such as by programming the connections 138 between the intra-block route lines 114 and the row route lines 112, and/or at the group level, such as by programming the connections 140 between the row route lines 112 and the local route lines 102.

Further, in other embodiments, the multi-level hierarchical routing matrix described above may vary in levels, connections, etc., based on the pattern-matching functionality implemented in the pattern-recognition processor 14. For example, other embodiments may include a different number of levels in the hierarchy, and/or different number of connections between levels, groups, rows, and/or blocks. Additionally, other embodiments may include different programmable functions usable for the programmable connections, different types of connections and different points in the hierarchy, the ability to programmatically break connection lines into multiple lines, and the ability to add and/or delete different functionality at different levels in the hierarchy.

Figure 22:
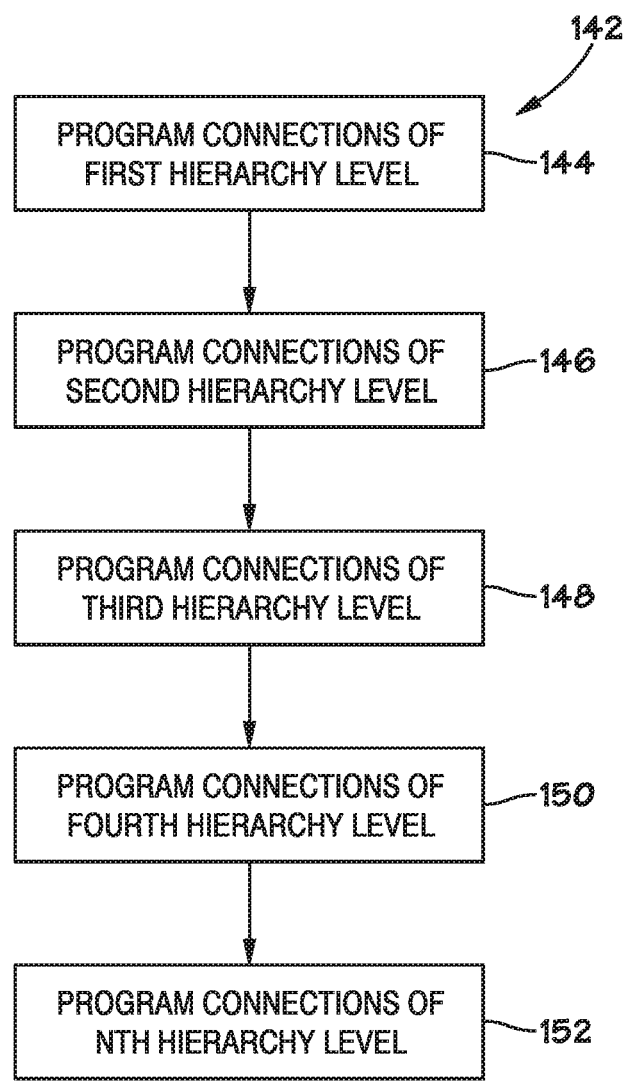
FIG. 22 is a flowchart of a process for programming the connections of a multi-level hierarchical routing matrix in accordance with an embodiment of the present invention.

FIG. 22 depicts a process 142 of configuration of the multi-level hierarchical routing matrix described above in accordance with an embodiment of the present invention. During configuration of the pattern-recognition processor 14, the connections at and between each level of the hierarchy may be programmed in any order. Further, such connections may be programmed manually or automatically based on the specific pattern-matching implementation desired in the pattern-recognition processor 14. It should also be appreciated that the programming of the connections at or between levels of the matrix may be dependent on the functionality programmed into other levels of the matrix. Initially, the connections at the first hierarchy level may be programmed (block 144). For example, this may include programming connections between the output of the feature cells 30 and the local route lines 102 and the inputs of the feature cells 30 and the local route lines 102, such as programming the connections 106 described above in FIG. 17. In some embodiments, the input and/or output connections from the feature cells 30 may be non-programmable connections and may not be programmed. For example, as also described above in FIG. 17, in one embodiment the output connections 104 may be non-programmable connections.

Next, the connections at a second level of the hierarchy may be programmed (block 146). In one embodiment such programming may include programming the input connections between the row route lines 108 and a group 94, as described above in FIG. 18. For example, the connections 112 between the input to the feature cells 30 and the row route lines 108 may be programmed to be a logical OR (or other function) of the inputs 105 to the feature cells 30. Similarly, the output connections 110 may be programmed to provide the desired functionality between the row route lines and the output drive selects 96 of the groups 94.

Additionally, the connections at a third level of the hierarchical routing matrix may be programmed (block 148). As discussed above in FIG. 19, in one embodiment the connections 116 between the row route lines 112 and the intra-block route lines 114 may be programmed. For example, the connections 116 may be programmed to provide the desired functionality between the intra-block route lines 114 and the row route lines 112, to isolate (disable) certain feature cells, or any other programmable function.

Next, the connections at a fourth hierarchy level may be programmed (block 150). In the embodiment depicted above in FIG. 20, such programming may include programming the connections between the intra-block route lines 114 and the top level route lines 118. For example, the connections 120 shown above in FIG. 20 may be programmed to provide the desired functionality between the top level route lines 118 and the intra-block route lines 114. As also discussed above in FIG. 21, in some embodiments, such programming may include disabling redundant capacity (e.g., feature cells) of the pattern-recognition processor 14. As shown in FIG. 22, such programming of the connections may continue up to the nth level of the routing matrix (block 152). By programming the connections of the routing matrix, the pattern-recognition processor 14 may be configured to provide the desired logic and next state routing between feature cells (and state machines). As mentioned above, the programming of the connections provides knowledge of the configuration of the pattern-recognition processor 14 yet also provides routing flexibility and changeability for different implementations

What is claimed is:
1. A system, comprising:
a host processor configured to initiate transmission of data to be analyzed; and
a state machine engine coupled to the host processor and configured to receive the data to be analyzed, wherein the state machine engine comprises:

a logical group comprising a plurality of route lines, a first feature cell, a second feature cell, and an output drive selector coupled to the first feature cell via a first non-programmable connection and coupled to the second feature cell via a second non-programmable connection, wherein the first feature cell and the second feature cell of the logical group are separate and distinct from any additional feature cells of any other logical group of the device, wherein the first feature cell comprises a data analysis element comprising a memory component programmed with configuration data, wherein the data analysis element is configured to analyze at least a portion of the data to be analyzed based on the configuration data and to output a result.

2. The system of claim 1, wherein each of the first feature cell and the second feature cell comprise a respective enable input and an enable output.

3. The system of claim 2, wherein the first feature cell is configured to transmit an output signal from the enable output of the first feature cell to the enable input of the second feature cell.

4. The system of claim 2, comprising a first programmable connection configured to selectively couple the enable input of the first feature cell to a first route line and a second programmable connection configured to selectively couple the enable input of the first feature cell to a second route line of a plurality of route lines.

5. The system of claim 2, comprising a non-programmable connection configured to couple the enable output of the first feature cell to a first route line.

6. The system of claim 1, comprising a first enable input connection configured to selectively couple the second feature cell to a first route line.

7. The system of claim 6, comprising a second enable input connection configured to selectively couple the first feature cell to a second route line of a plurality of route lines.

8. The system of claim 1, comprising a first enable output connection configured to couple the first feature cell to a first route line.

9. The system of claim 8, comprising a second enable output connection configured to couple the second feature cell to a second route line of a plurality of route lines.

10. The system of claim 1, wherein the output drive selector is configured to provide an output drive signal of the logical group.

11. The system of claim 10, wherein the output drive selector is configured to provide the output drive signal based on a selection of an output signal of the first feature cell, an output of the second feature cell, or a logical combination of the output signal of the first feature cell and the output of the second feature cell.

12. A system, comprising:
a host processor configured to initiate transmission of data to be analyzed;
a memory coupled to the host processor and configured to store the data to be analyzed; and
a state machine engine coupled to the host processor and to the memory to receive the data to be analyzed, wherein the state machine engine comprises:
a first logical group comprising a first plurality of route lines, a first feature cell, a second feature cell, and a first output drive selector coupled to the first feature cell via a first non-programmable connection and coupled to the second feature cell via a second non-programmable connection, wherein the first feature cell comprises a data analysis element comprising a memory component programmed with configuration data, wherein the data analysis element is configured to analyze at least a portion of the data to be analyzed based on the configuration data and to output a result;
a second logical group comprising a second plurality of route lines, a third feature cell, a fourth feature cell, and a second output drive selector coupled to the third feature cell via a third non-programmable connection and coupled to the fourth feature cell via a fourth non-programmable connection, wherein the first feature cell and the second feature cell of the first logical group are separate and distinct from the third feature cell and the fourth feature cell of the second logical group.

13. The system of claim 12, wherein the first output drive selector is configured to provide an output drive signal of the first logical group based upon a selection by the first output drive selector.

14. The system of claim 13, wherein the second feature cell is configured to transmit a second output drive signal based on the first output drive signal to the first output drive selector.

15. The system of claim 14, wherein the first output drive selector is configured to transmit the second output drive signal to a row route line of a plurality of row route lines of the state machine engine.

16. The system of claim 15, wherein the third feature cell is configured to receive the second output drive signal from the row route line as an input signal to the third feature cell.

17. The system of claim 16, wherein the third feature cell is configured to generate a third output drive signal based on the second output drive signal.

18. A system, comprising:
a host processor configured to initiate transmission of data to be analyzed; and
a state machine engine coupled to the host processor and configured to receive the data to be analyzed, wherein the state machine engine comprises:
a finite state machine lattice comprising:
a plurality of blocks, wherein each block of the plurality of blocks comprises a plurality of rows, wherein each row of the plurality of rows comprises a plurality of logical groups, wherein each logical group comprises:
a plurality of route lines;
a first feature cell comprising a first data analysis element comprising a first plurality of memory cells programmed with first configuration data, wherein the first data analysis element is configured to analyze at least a portion of the data to be analyzed based on the first configuration data and to output a first result;
a second feature cell comprising a second data analysis element comprising a second plurality of memory cells programmed with second configuration data, wherein the second data analysis element is configured to analyze at least a second portion of the data to be analyzed based on the second configuration data and to output a second result; and
an output drive selector coupled to the first feature cell via a first non-programmable connection and coupled to the second feature cell via a second non-programmable connection, wherein the output drive selector is configured to transmit an output drive signal based upon a selection by the output drive selector.

19. The system of claim 18, wherein the plurality of logical groups of each row of the plurality of rows are interconnected via a plurality of row route lines.

20. The system of claim 19, wherein the plurality of rows of each block of the plurality of blocks are interconnected via a plurality of intra-block route lines.

* * * * *